(12) United States Patent
Hwang

(10) Patent No.: US 11,730,017 B2
(45) Date of Patent: Aug. 15, 2023

(54) DISPLAY DEVICE AND METHOD OF FABRICATING THE SAME

(71) Applicant: Samsung Display Co., Ltd., Yongin-Si (KR)

(72) Inventor: Jaekwon Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/552,972

(22) Filed: Aug. 27, 2019

(65) Prior Publication Data

US 2020/0152717 A1 May 14, 2020

(30) Foreign Application Priority Data

Nov. 13, 2018 (KR) .................. 10-2018-0139326
Mar. 25, 2019 (KR) .................. 10-2019-0033816

(51) Int. Cl.
*H01L 51/50* (2006.01)
*H10K 59/122* (2023.01)
(Continued)

(52) U.S. Cl.
CPC ......... *H10K 59/122* (2023.02); *H10K 50/844* (2023.02); *H10K 50/865* (2023.02);
(Continued)

(58) Field of Classification Search
None
See application file for complete search history.

(56) References Cited

U.S. PATENT DOCUMENTS

| 7,294,856 | B2 | 11/2007 | Ito et al. |
| 7,608,992 | B2 | 10/2009 | Kobayashi |

(Continued)

FOREIGN PATENT DOCUMENTS

| CN | 110021629 | 7/2019 |
| EP | 2819173 | 12/2014 |

(Continued)

OTHER PUBLICATIONS

Examination Report dated Mar. 24, 2020 in the European Patent Application No. 19208186.7.

*Primary Examiner* — Ali Naraghi
(74) *Attorney, Agent, or Firm* — H.C. Park & Associates, PLC

(57) ABSTRACT

A method of fabricating a display device may include forming a preliminary first pixel definition layer by coating a first material on a base substrate including a first electrode, forming a first pixel definition layer by forming a first opening in the preliminary first pixel definition layer, the first opening exposing the first electrode, performing a plasma treatment on the first pixel definition layer, forming a preliminary organic layer by providing a first organic material, forming a preliminary second pixel definition layer by coating a second material on the first pixel definition layer, forming a second pixel definition layer by forming a second opening in the preliminary second pixel definition layer, the second opening overlapping with the first opening, and forming an organic layer by providing a second organic material. A thickness of the organic layer may be greater than a thickness of the preliminary organic layer.

15 Claims, 22 Drawing Sheets

(51) Int. Cl.
    *H10K 50/844* (2023.01)
    *H10K 50/86* (2023.01)
    *H10K 59/38* (2023.01)
    *H10K 71/00* (2023.01)
    *H10K 71/40* (2023.01)
    *H10K 71/13* (2023.01)
    *H10K 71/20* (2023.01)
    *H10K 59/12* (2023.01)

(52) U.S. Cl.
    CPC ............ *H10K 59/38* (2023.02); *H10K 71/00* (2023.02); *H10K 71/135* (2023.02); *H10K 71/211* (2023.02); *H10K 71/233* (2023.02); *H10K 71/40* (2023.02); *H10K 59/1201* (2023.02)

(56) References Cited

U.S. PATENT DOCUMENTS

| | | | |
|---|---|---|---|
| 7,777,411 | B2 | 8/2010 | Seki |
| 8,389,323 | B2 | 3/2013 | Choi et al. |
| 9,450,034 | B2 | 9/2016 | Lee et al. |
| 9,450,211 | B2 | 9/2016 | Ahn et al. |
| 10,529,274 | B2 | 1/2020 | Sasaki |
| 10,636,845 | B2 | 4/2020 | Nishioka et al. |
| 10,847,592 | B2 | 11/2020 | Kim et al. |
| 2005/0007398 | A1 | 1/2005 | Hirai |
| 2005/0112341 | A1* | 5/2005 | Ito ........................ H10K 59/122 428/209 |
| 2005/0191781 | A1 | 9/2005 | Hirai |
| 2006/0159895 | A1 | 7/2006 | Katagami et al. |
| 2007/0071885 | A1 | 3/2007 | Kumagai |
| 2013/0248867 | A1* | 9/2013 | Kim ..................... H10K 50/844 438/34 |
| 2015/0014636 | A1* | 1/2015 | Kang ................. H10K 50/8428 438/26 |
| 2017/0062528 | A1* | 3/2017 | Aoyama .............. H10K 59/122 |
| 2018/0138435 | A1* | 5/2018 | Kim ....................... H10K 71/13 |
| 2018/0351133 | A1* | 12/2018 | Yoo ...................... H10K 50/858 |
| 2019/0267437 | A1* | 8/2019 | Hou ......................... H10K 50/17 |
| 2020/0127225 | A1* | 4/2020 | Zhang ................. H10K 59/124 |

FOREIGN PATENT DOCUMENTS

| | | |
|---|---|---|
| EP | 2860785 | 4/2015 |
| JP | 2004086014 | 3/2004 |
| JP | 2005174906 | 6/2005 |
| JP | 2005174907 | 6/2005 |
| JP | 2007242592 | 9/2007 |
| JP | 4857688 | 1/2012 |
| JP | 2015197956 | 11/2015 |
| JP | 2018087906 | 6/2018 |
| JP | 6378856 | 8/2018 |
| KR | 10-0606948 | 8/2006 |
| KR | 10-0619486 | 9/2006 |
| KR | 10-2016-0129995 | 11/2016 |

* cited by examiner

<Comparative Example>

<Comparative Example>

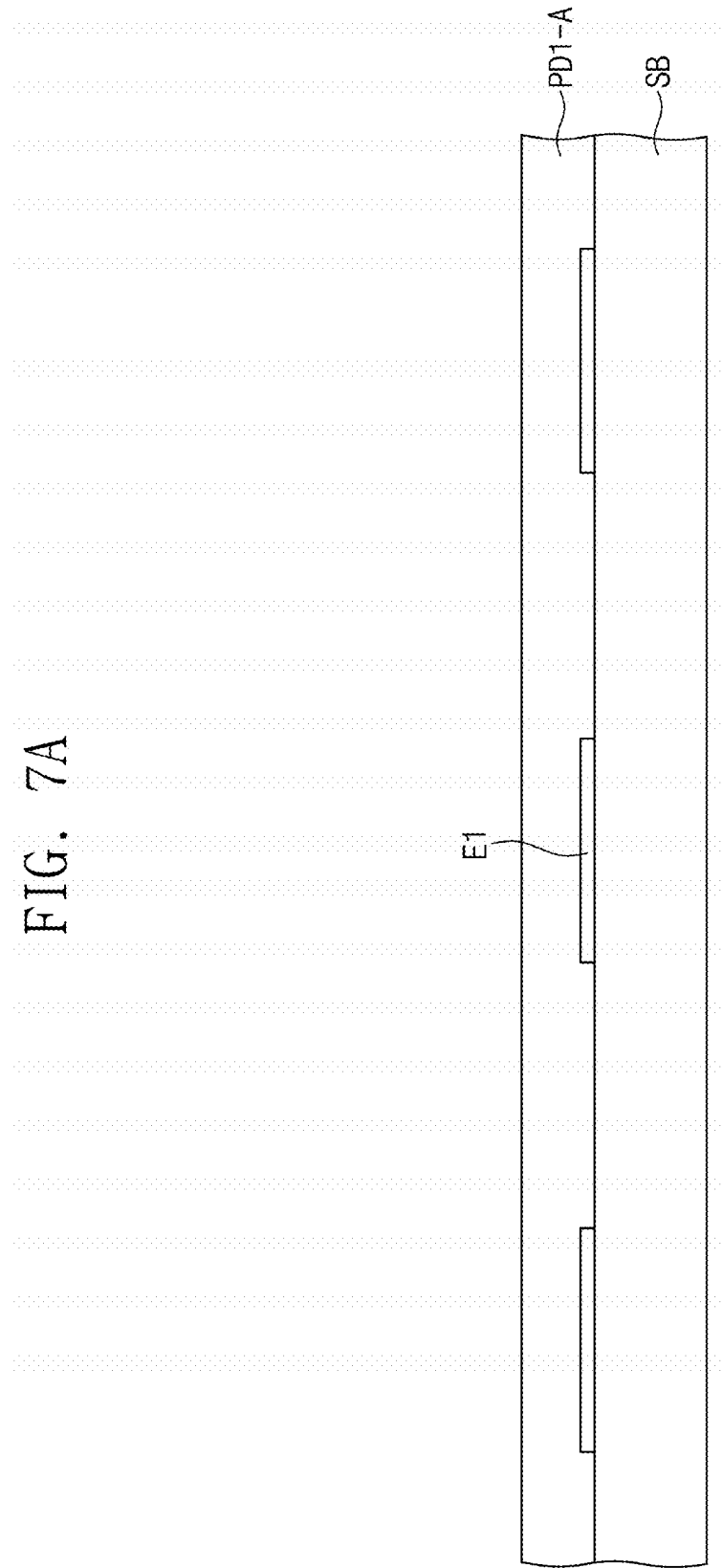

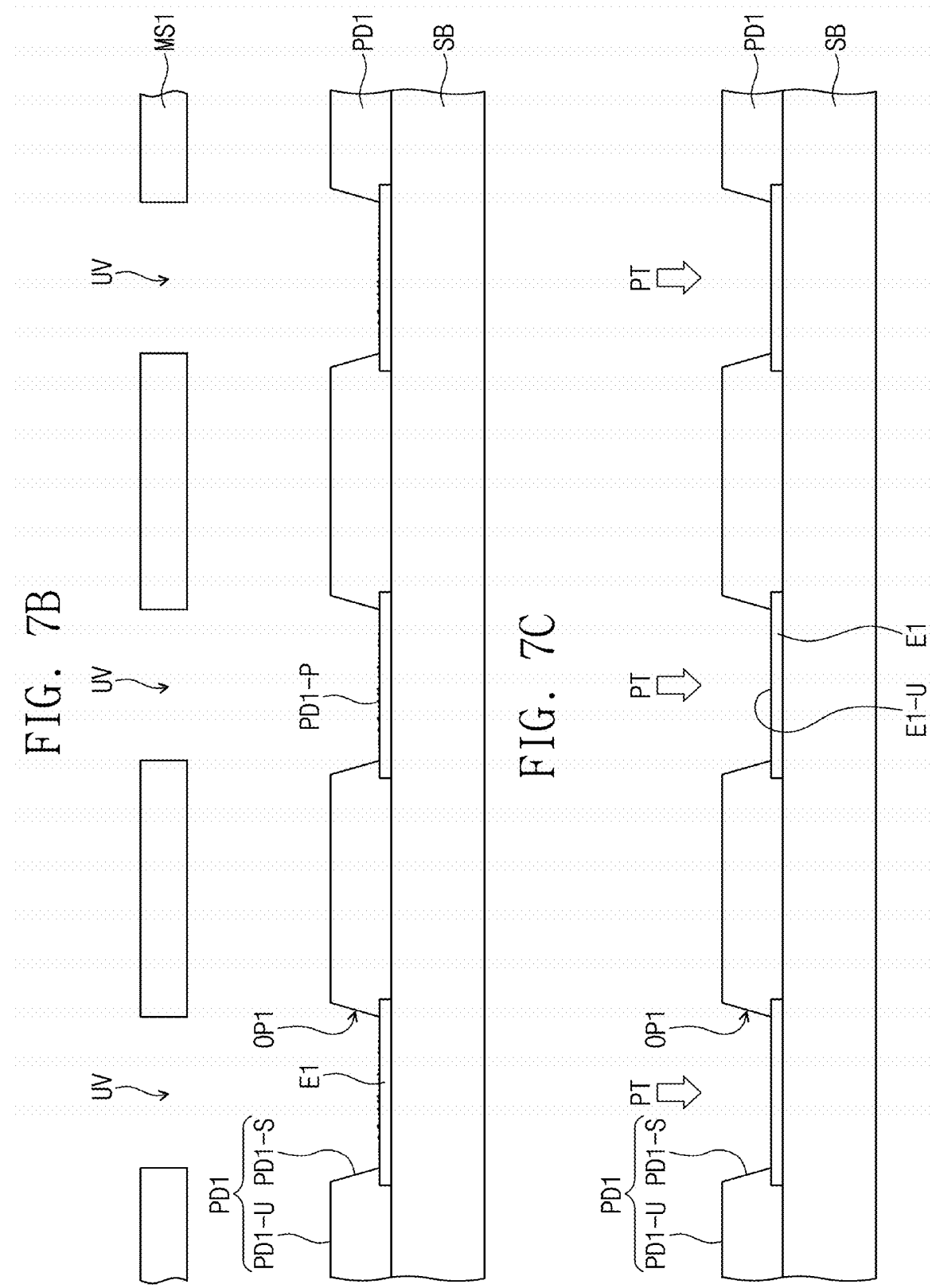

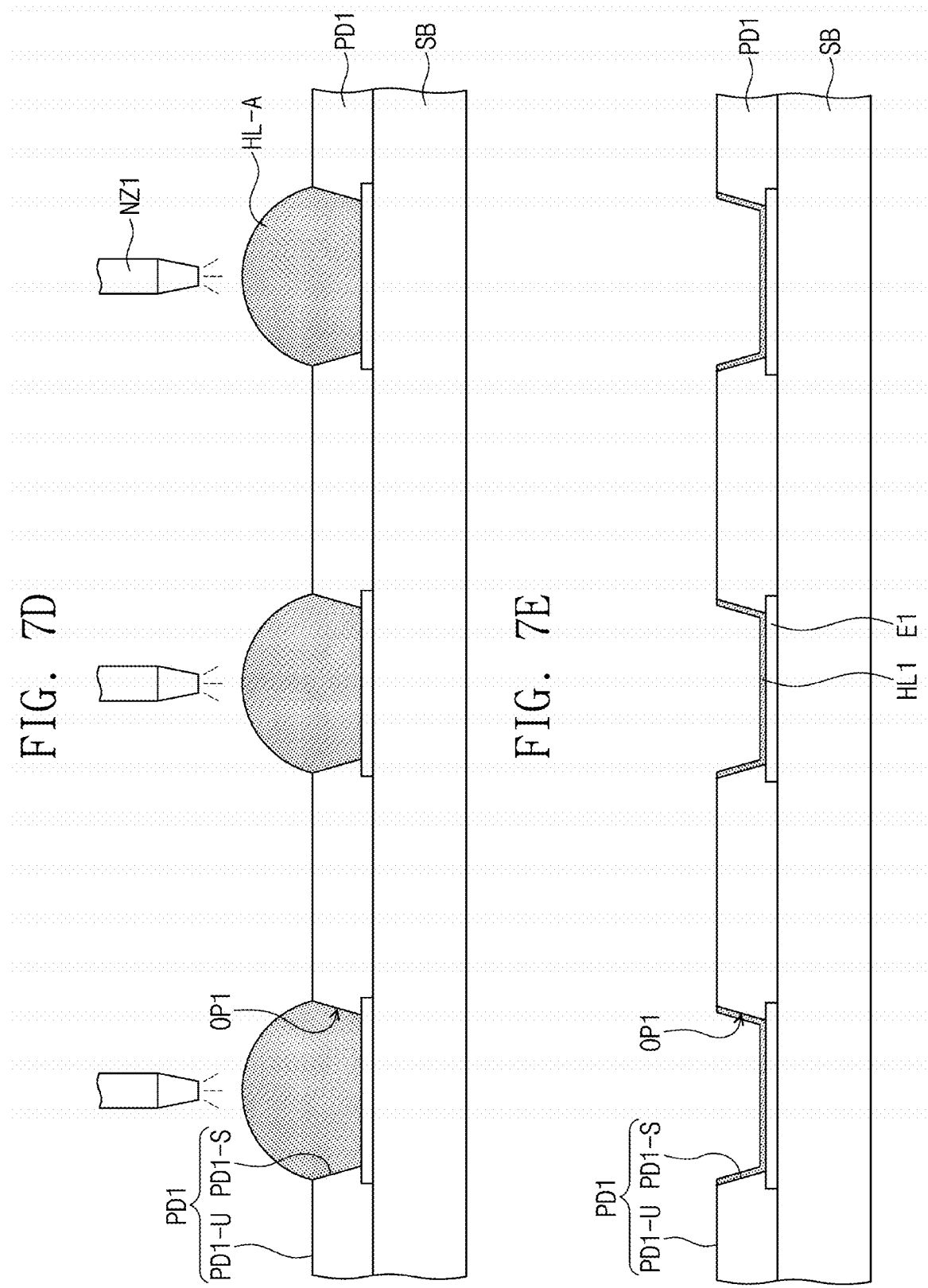

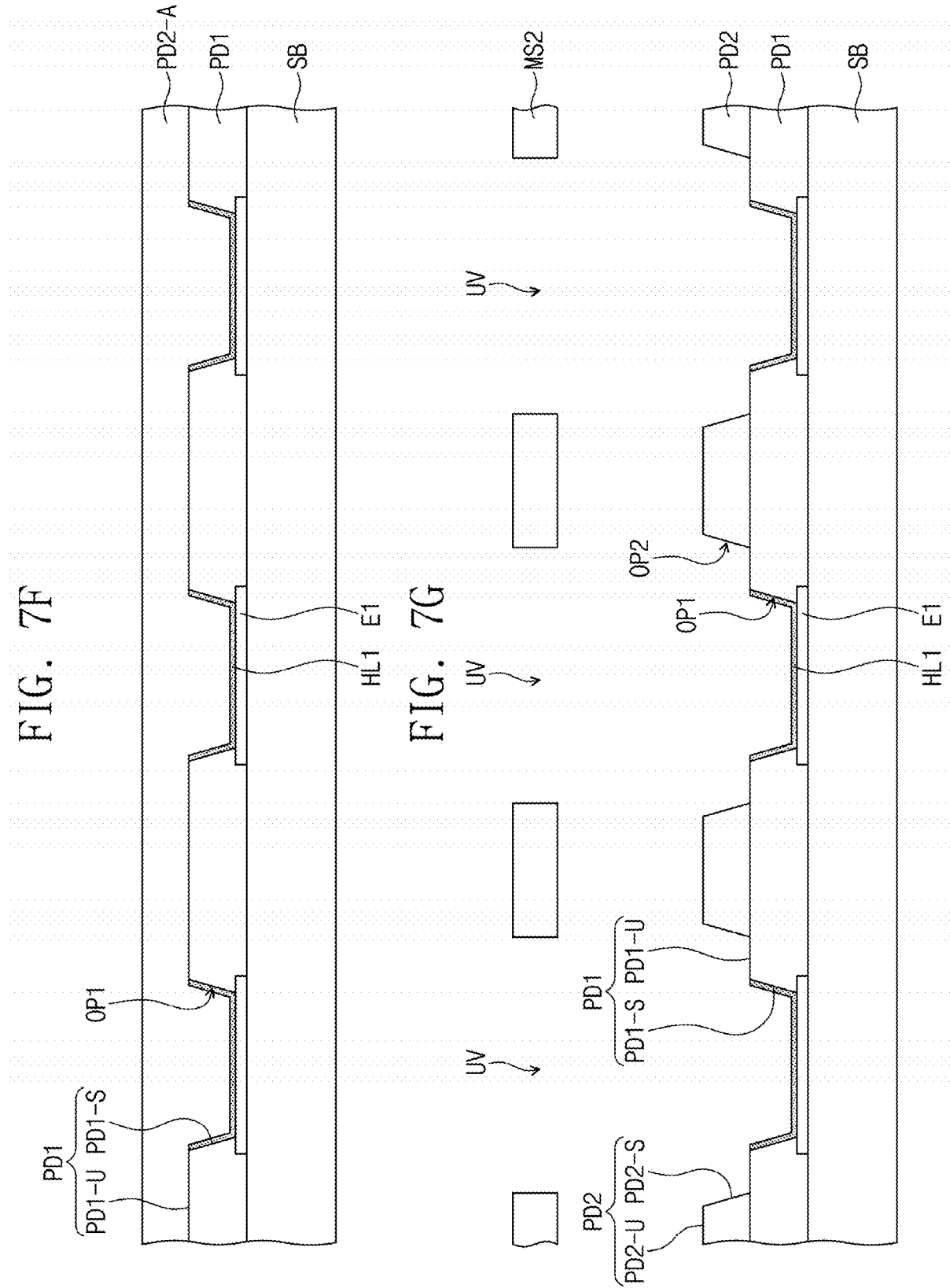

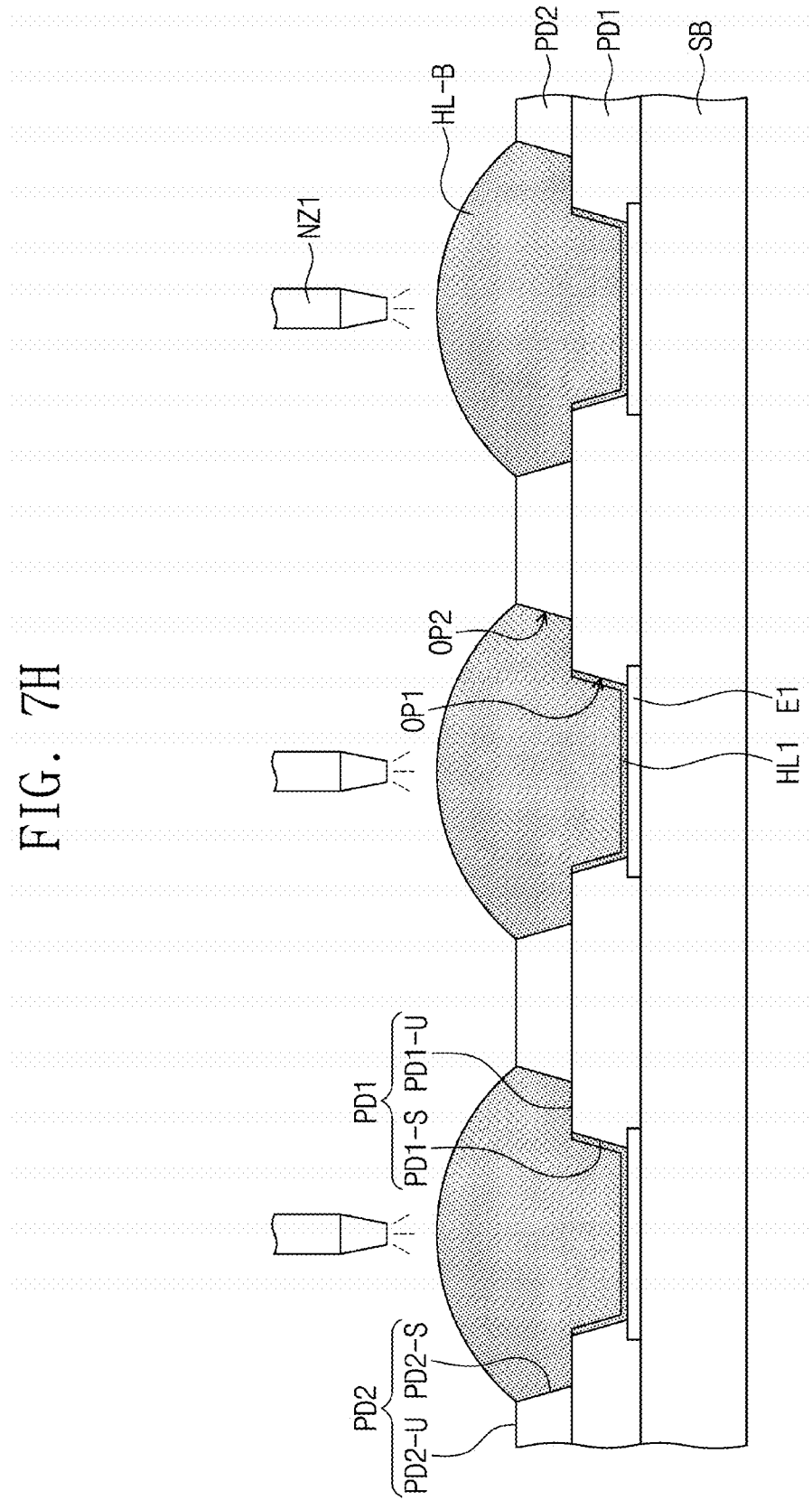

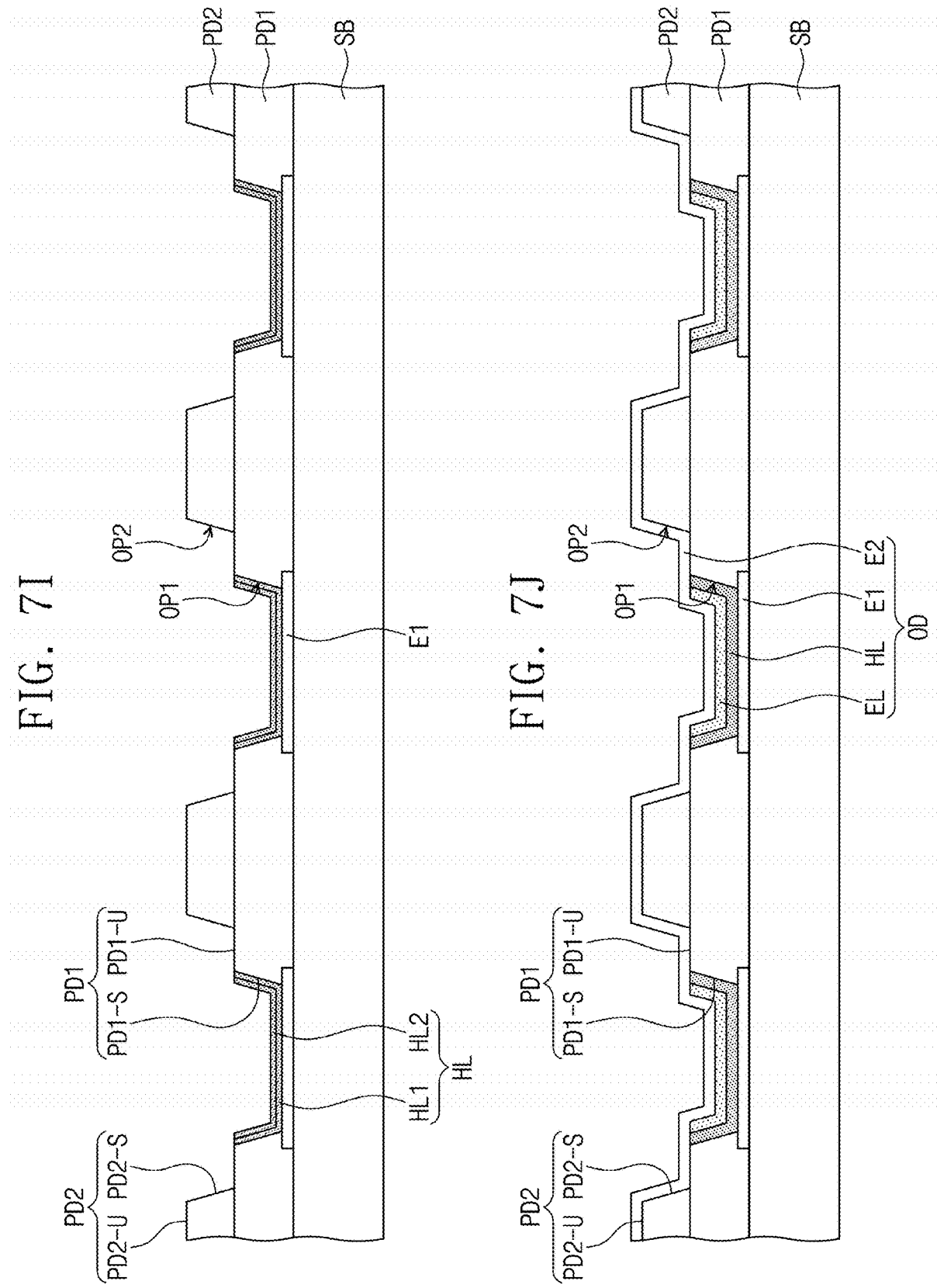

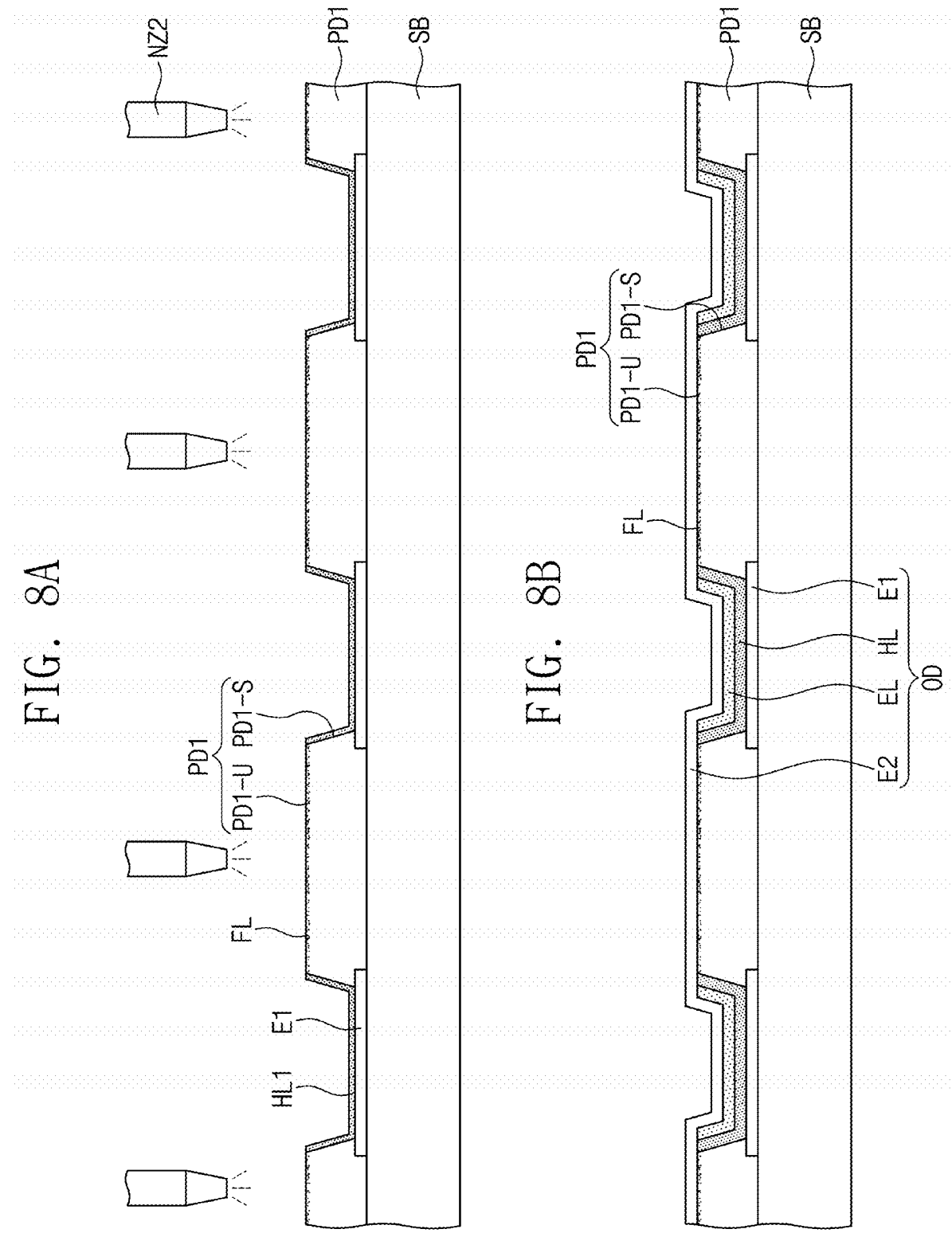

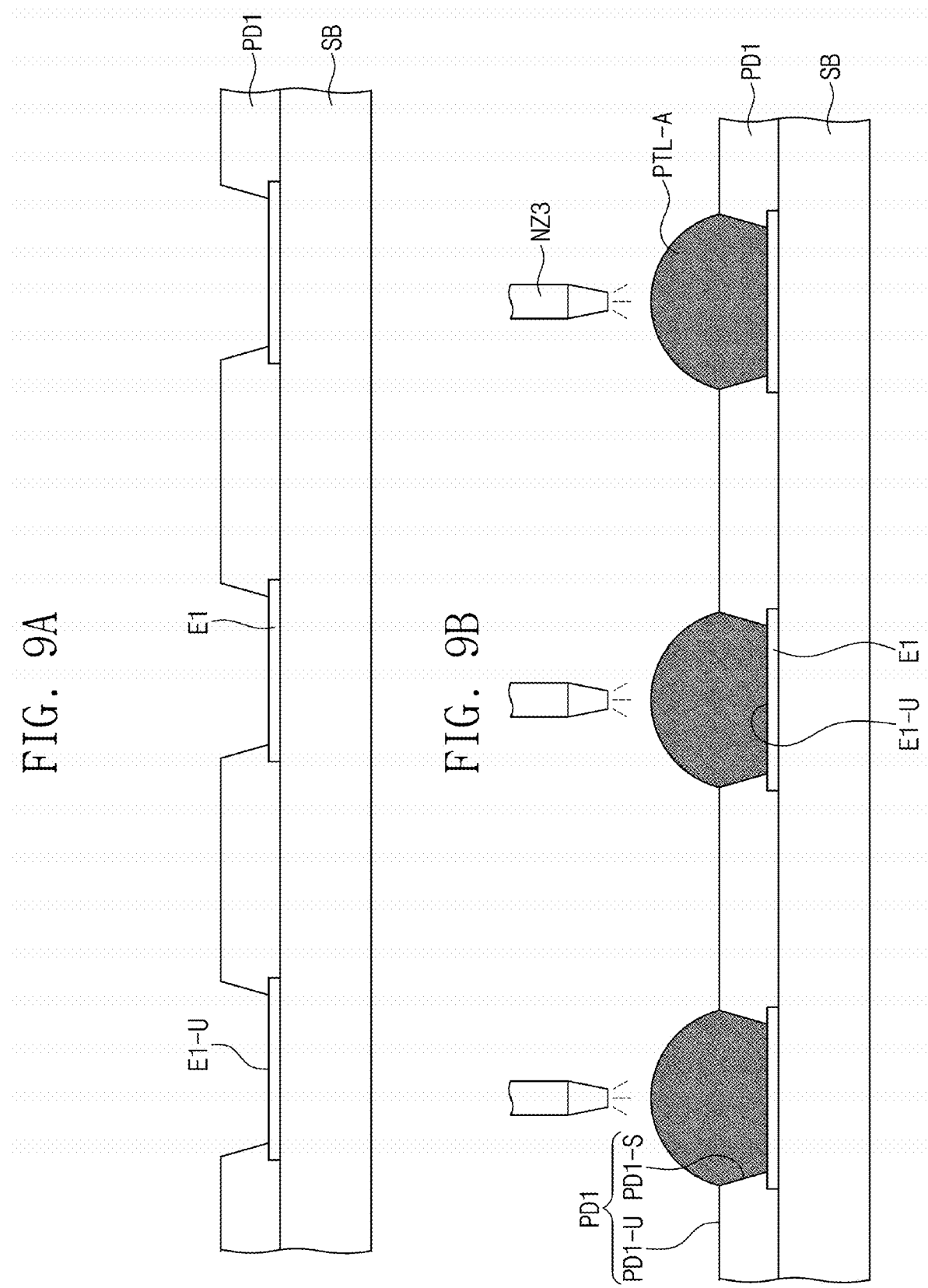

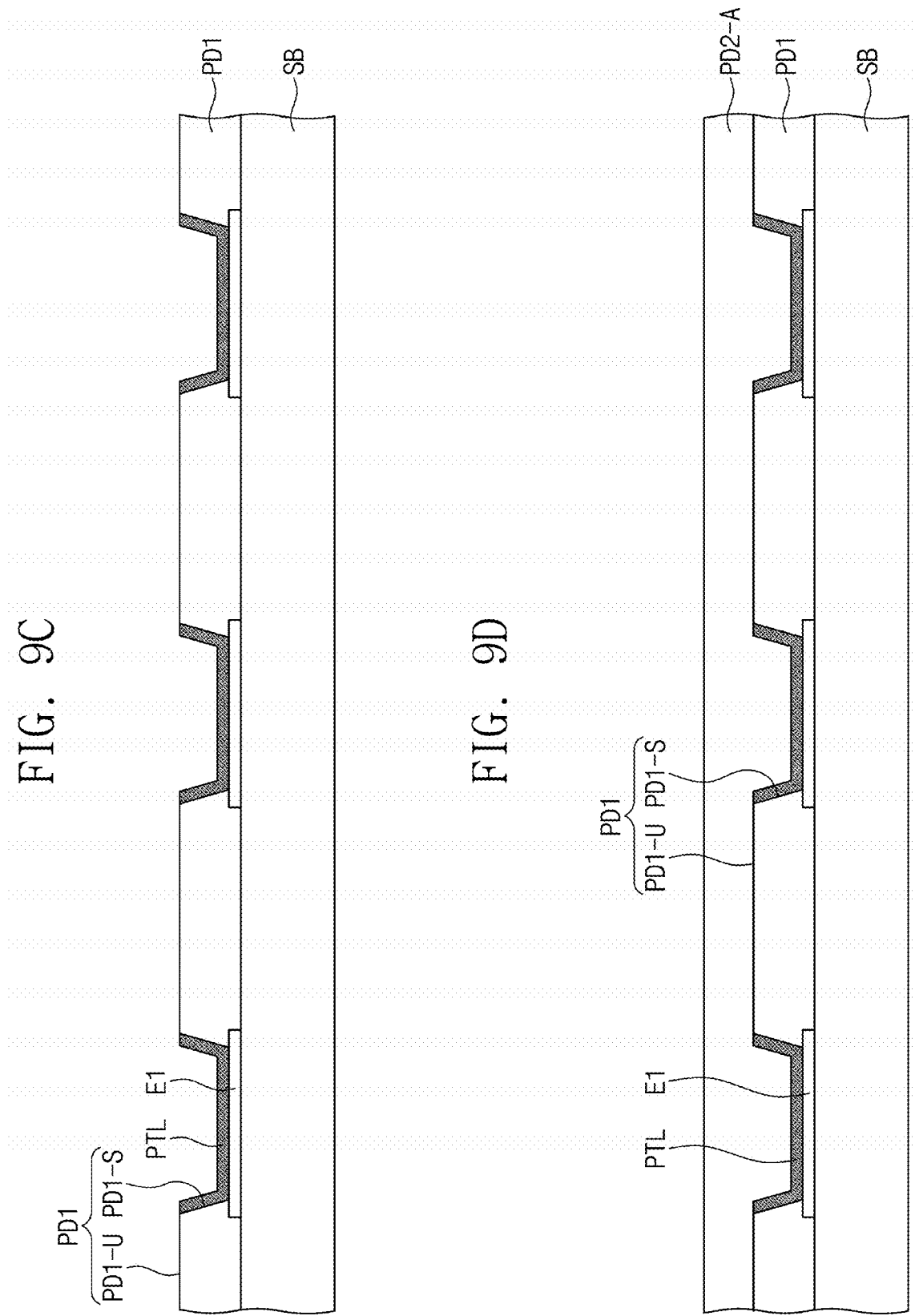

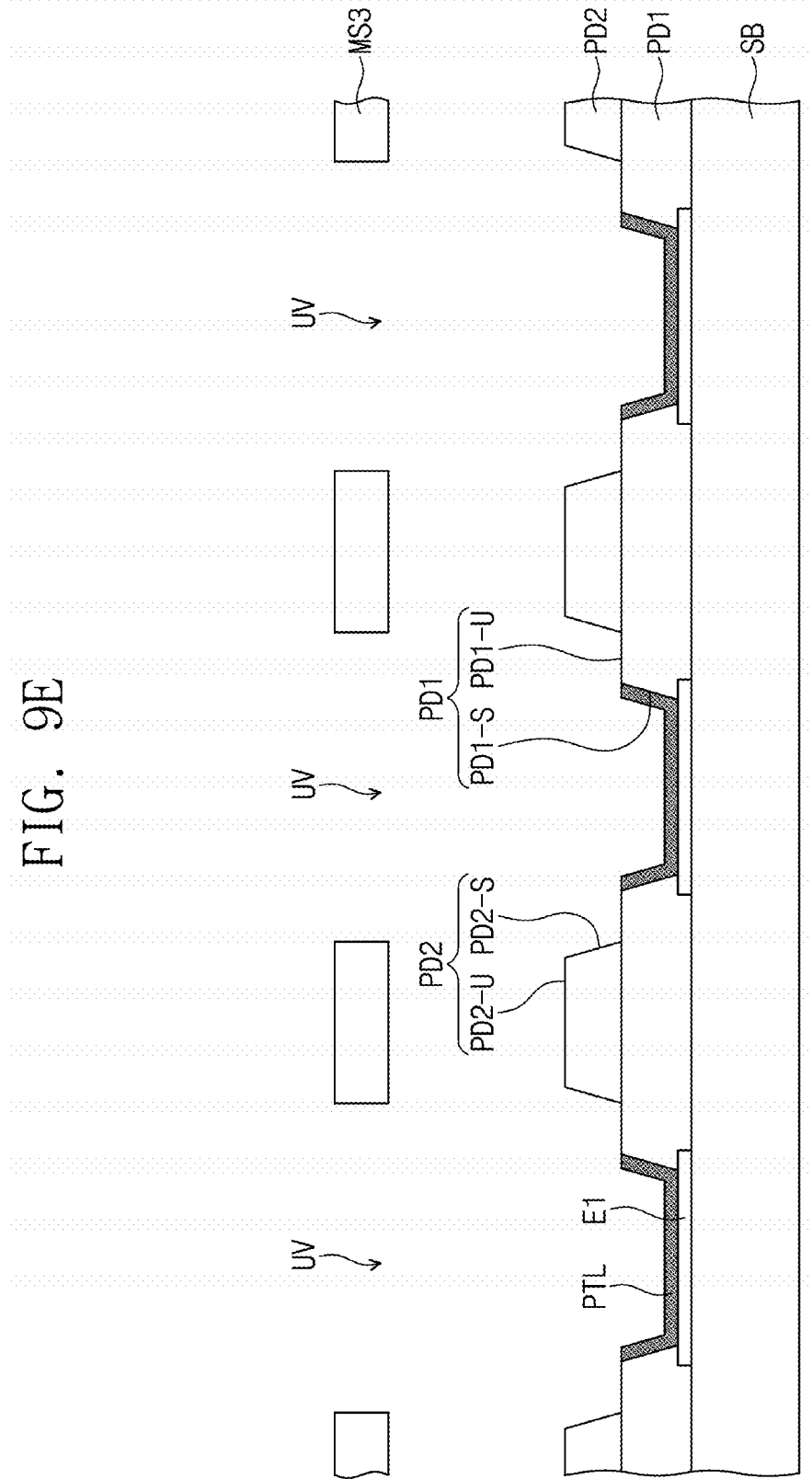

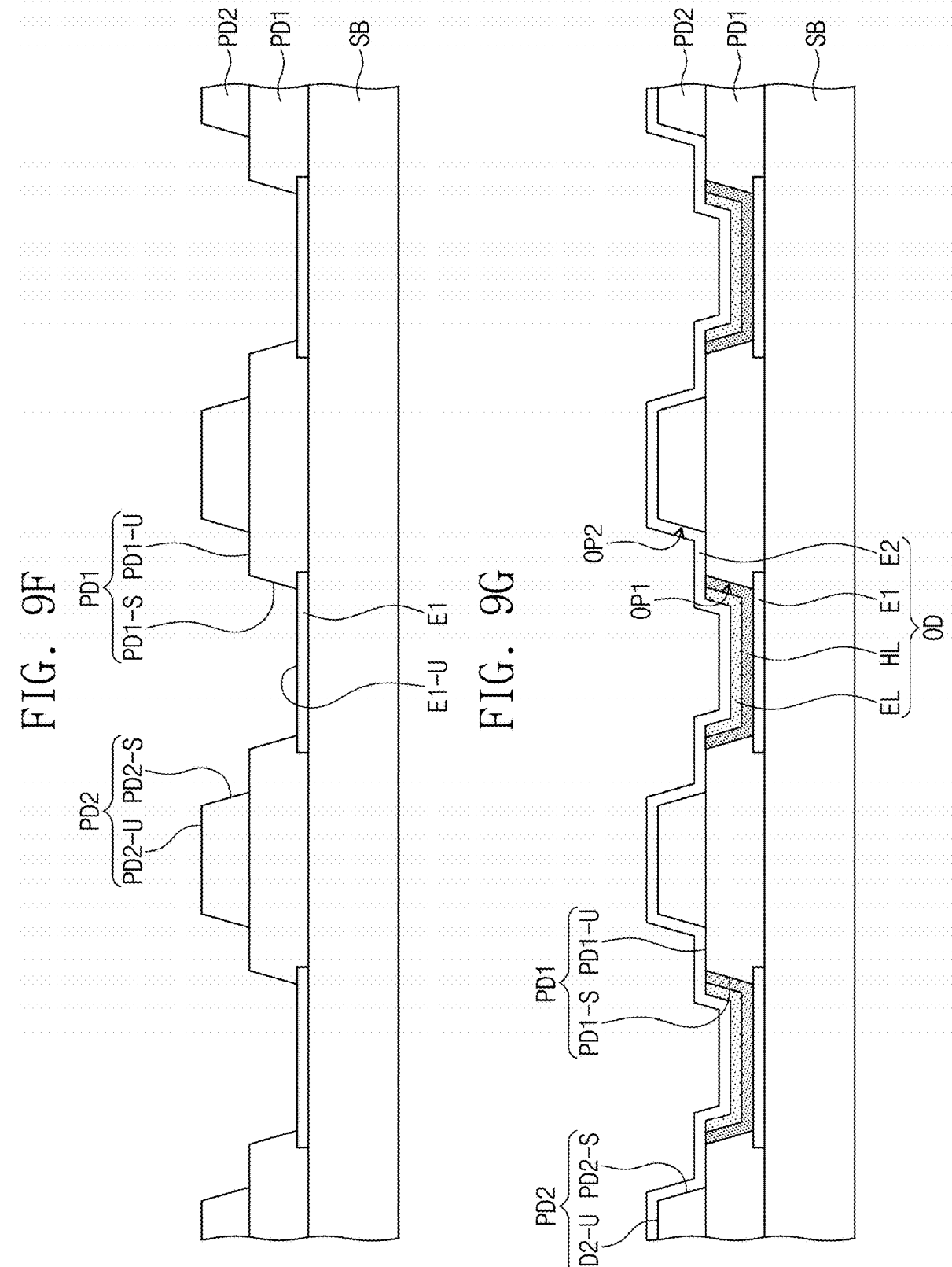

DISPLAY DEVICE AND METHOD OF FABRICATING THE SAME

CROSS-REFERENCE TO RELATED APPLICATION

This application claims priority from and the benefit of Korean Patent Application Nos. 10-2018-0139326 and 10-2019-0033816, filed on Nov. 13, 2018, and Mar. 25, 2019, respectively, which are hereby incorporated by reference for all purposes as if fully set forth herein.

BACKGROUND

Field

Exemplary implementations of the invention relate generally to a display device and a method of fabricating the same, and more specifically, to a display device with improved process reliability and a method of fabricating the same.

Discussion of the Background

There is an increasing demand for portable, thin, flat panel display devices. A light-emitting display device, which is one of the flat panel display devices, is a self-luminescent display device with technical advantages, such as a large viewing angle, a good contrast property, and a fast response speed and is emerging as a next-generation display device. In addition, with regard to a material for an organic light emitting layer, an organic light emitting display device including an organic material is superior to an inorganic light-emitting display device, in terms of brightness, driving voltage, response speed, and realization of multi-chromatic characteristics.

To realize a natural color image, the organic light emitting display device includes sub pixels emitting red, green, and blue lights. For example, a red sub pixel includes an organic light emitting layer emitting a red light, a green sub pixel includes an organic light emitting layer emitting a green light, and a blue sub pixel includes an organic light emitting layer emitting a blue light.

If the organic light emitting layer is not formed on a desired sub pixel or is formed on a neighboring sub pixel, organic light emitting layers for emitting different color lights are mixed, and this leads to deterioration in image quality of the organic light emitting display device.

Especially, this issue limits the improvement of image quality when the organic light emitting layer is formed by a nozzle printing method of dropping solution containing an organic light emitting material using a nozzle.

The above information disclosed in this Background section is only for understanding of the background of the inventive concepts, and, therefore, it may contain information that does not constitute prior art.

SUMMARY

Devices constructed and methods according to exemplary implementations provide a display device including a pixel definition layer having an improved repellency to an organic material and a method of easily forming an organic layer of an organic light emitting element of the display device.

Additional features of the inventive concepts will be set forth in the description which follows, and in part will be apparent from the description, or may be learned by practice of the inventive concepts.

According to one or more exemplary embodiments of the invention, a display device may include a circuit device layer including a transistor, a display element layer, and an encapsulation layer disposed on the display element layer. The display element layer may include a first electrode connected to the transistor, a second electrode disposed on the first electrode, an organic layer interposed between the first electrode and the second electrode, a first pixel definition layer including a first opening exposing the first electrode, and a second pixel definition layer disposed on the first pixel definition layer, the second pixel definition layer including a second opening overlapping the first opening. A top surface of the first pixel definition layer may be exposed by the organic layer.

The first pixel definition layer may have a first repellency to the organic layer and the second pixel definition layer may have a second repellency to the organic layer, the second repellency being greater than the first repellency.

The organic layer may be in contact with the first electrode and a side surface of the first pixel definition layer defining the first opening.

A width of the first opening in a direction may be smaller than a width of the second opening in the direction.

The first opening may include a plurality of first openings and the second opening may include a plurality of second openings, and the plurality of first openings and the plurality of second openings corresponding to the first openings may be overlapped with each other in a plan view.

The first electrode may include a plurality of first electrodes, the plurality of first electrodes overlapping the first openings, respectively, and the second electrode may be overlapped with the first electrodes.

The second electrode may cover the second pixel definition layer, the top surface of the first pixel definition layer, and the organic layer.

The encapsulation layer may include a first inorganic encapsulation layer covering the second electrode, a second inorganic encapsulation layer disposed on the first inorganic encapsulation layer, and an organic encapsulation layer interposed between the first inorganic encapsulation layer and the second inorganic encapsulation layer.

The second pixel definition layer may be spaced apart from the organic layer.

A side surface of the first pixel definition layer defining the first opening and a side surface of the second pixel definition layer defining the second opening may be provided to form a stepwise structure.

The organic layer may include at least one of a hole injection layer, a hole transport layer, and an organic light emitting layer.

According to one or more exemplary embodiments of the invention, a display device may include a first pixel definition layer including a first opening, a second pixel definition layer disposed on the first pixel definition layer, the second pixel definition layer may include a second opening overlapped with the first opening is defined, and an organic light emitting element. The organic light emitting element may include a first electrode exposed by the first opening, a second electrode disposed on the first electrode, and an organic layer interposed between the first electrode and the second electrode. A repellency of the second pixel definition layer to the organic layer may be greater than a repellency of the first pixel definition layer to the organic layer.

A top surface of the first pixel definition layer may be exposed by the organic layer.

The organic layer may be in contact with the first electrode and a side surface of the first pixel definition layer defining the first opening.

The second pixel definition layer may be spaced apart from the organic layer.

The organic layer may be overlapped with each of the first opening and the second opening.

A width of the first opening in a direction may be smaller than a width of the second opening in the direction.

According to one or more exemplary embodiments of the invention, a method of fabricating a display device includes forming a preliminary first pixel definition layer by coating a first material on a base substrate including a first electrode, forming a first pixel definition layer by forming a first opening in the preliminary first pixel definition layer, the first opening exposing the first electrode, performing a plasma treatment on the first pixel definition layer, forming a preliminary organic layer by providing a first organic material, forming a preliminary second pixel definition layer by coating a second material on the first pixel definition layer, forming a second pixel definition layer by forming a second opening in the preliminary second pixel definition layer, the second opening overlapping with the first opening, and forming an organic layer by providing a second organic material. A thickness of the organic layer may be greater than a thickness of the preliminary organic layer.

The forming of the organic layer may include providing the second organic material to fill the first opening and the second opening and drying the second organic material.

A top surface of the first pixel definition layer may be exposed by the organic layer, after the drying of the second organic material.

The forming of the preliminary organic layer may include providing the first organic material in the first opening to expose a top surface of the first pixel definition layer and drying the first organic material.

A top surface of the first pixel definition layer may be exposed by the preliminary organic layer, after the drying of the first organic material.

The first organic material may be a same as the second organic material.

The preliminary first pixel definition layer may have an initial repellency to the first organic material. The first pixel definition layer may have a first repellency, which is less than the initial repellency, to the first organic material. The first repellency may be obtained by reducing the initial repellency through the plasma treatment.

The first organic material may be different from the second organic material.

The method may further include removing the preliminary organic layer, after the forming of the second pixel definition layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 7A, 7B, 7C, 7D, 7E, 7F, 7G, 7H, 7I, and 7J are sectional views illustrating a method of fabricating a display device according to an exemplary embodiment.

FIGS. 8A and 8B are sectional views illustrating a method of fabricating a display device according to an exemplary embodiment.

FIGS. 9A, 9B, 9C, 9D, 9E, 9F, and 9G are sectional views illustrating a method of fabricating a display device according to an exemplary embodiment.

Figure 1:
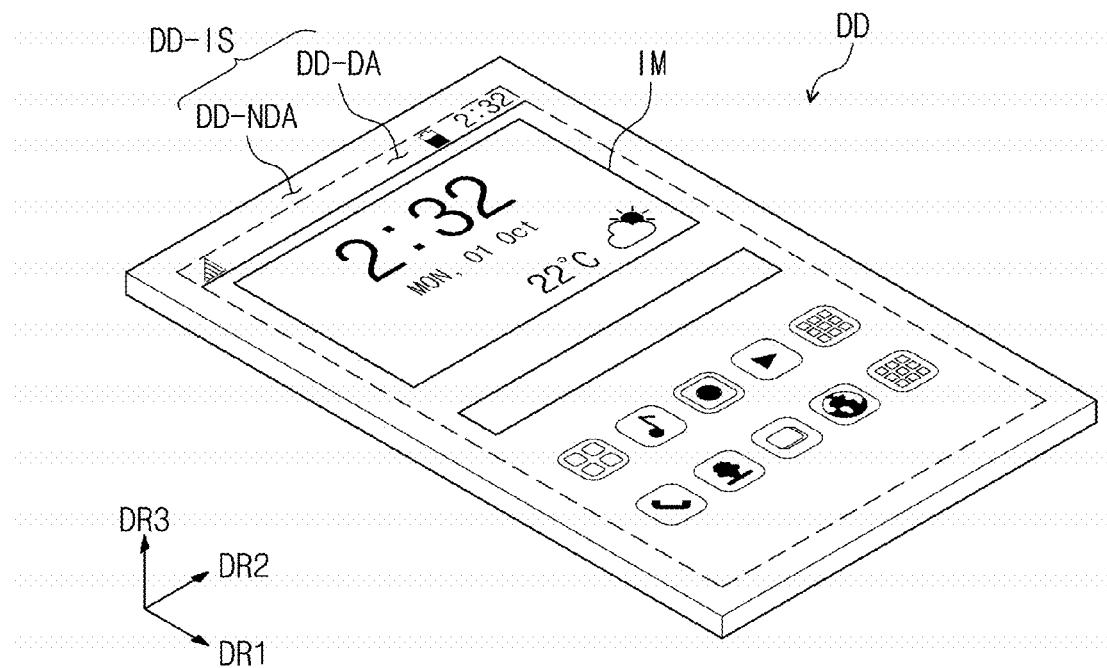
FIG. 1 is a perspective view illustrating a display device according to an exemplary embodiment.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or to exaggerated for clarity. The use of similar or identical reference numbers in the various drawings is intended to indicate the presence of a similar or identical element or feature.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using to software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
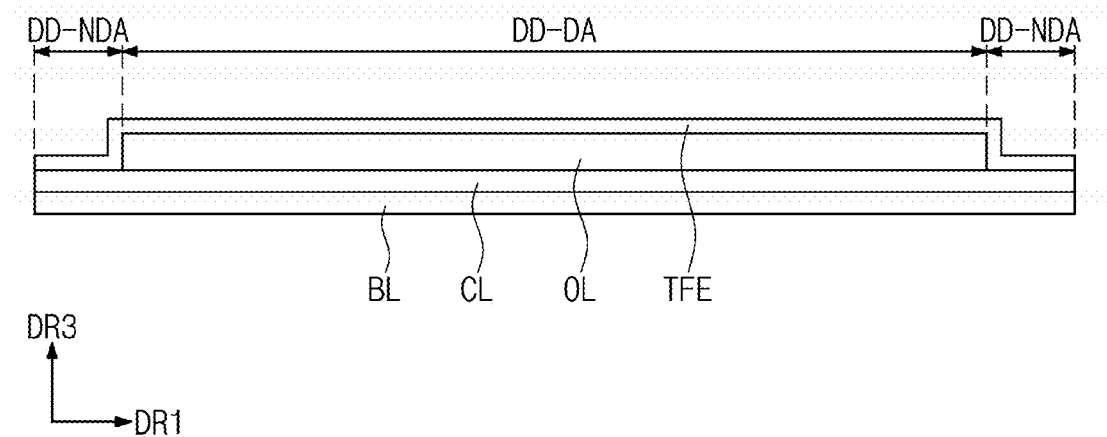
FIG. 2 is a sectional view illustrating a display device according to an exemplary embodiment.
Figure 3A:
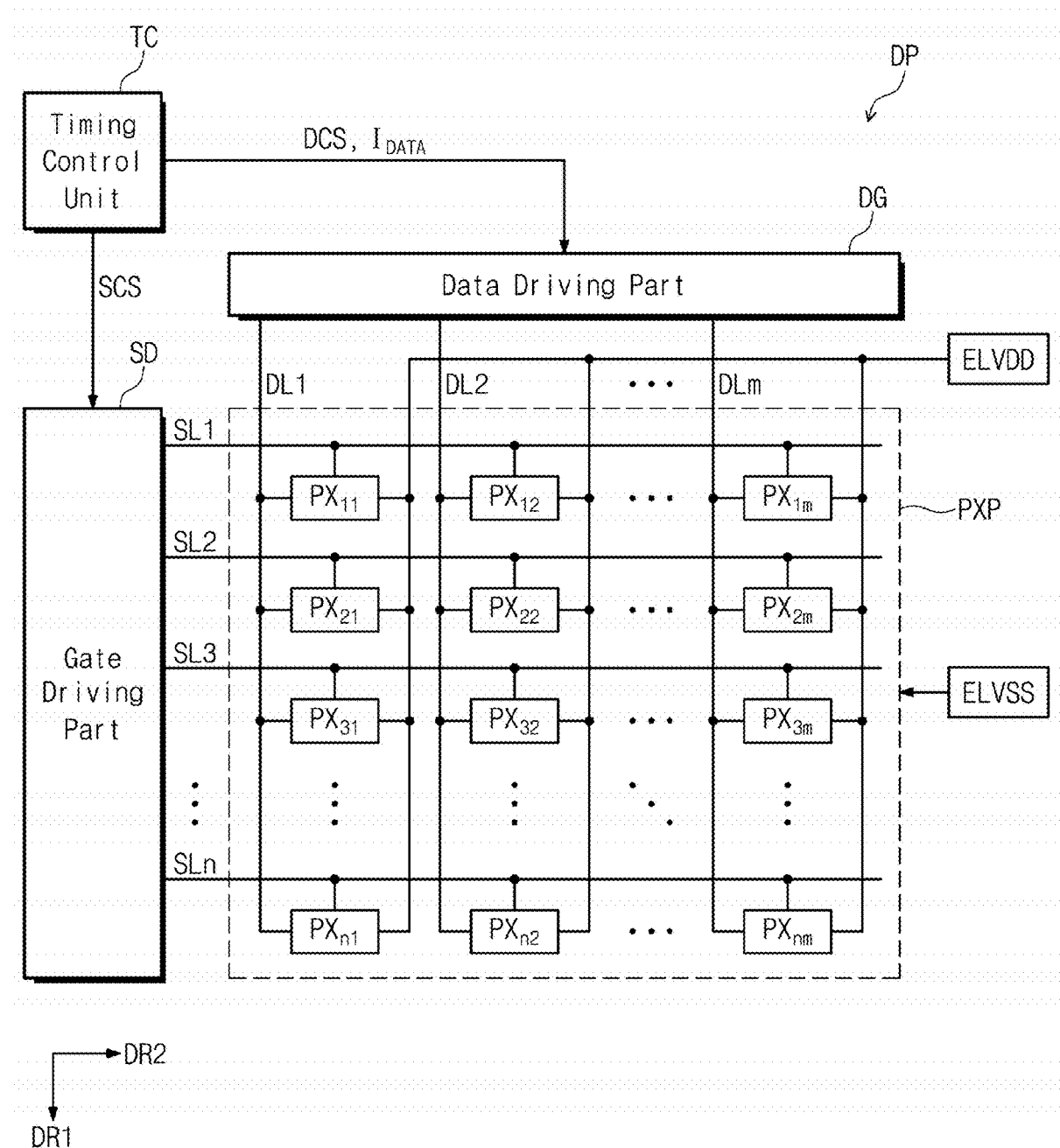
FIG. 3A is a block diagram illustrating a display device according to an exemplary embodiment.
Figure 3B:
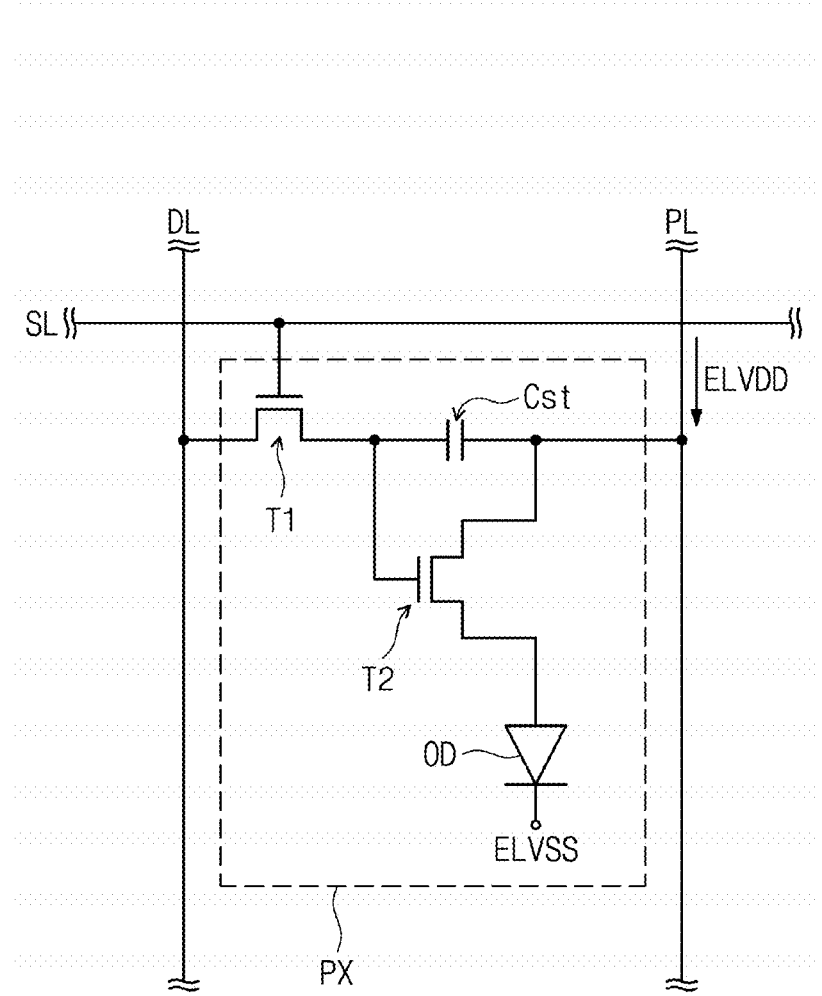
FIG. 3B is an equivalent circuit diagram of the pixel shown in FIG. 3A.
Figure 3C:
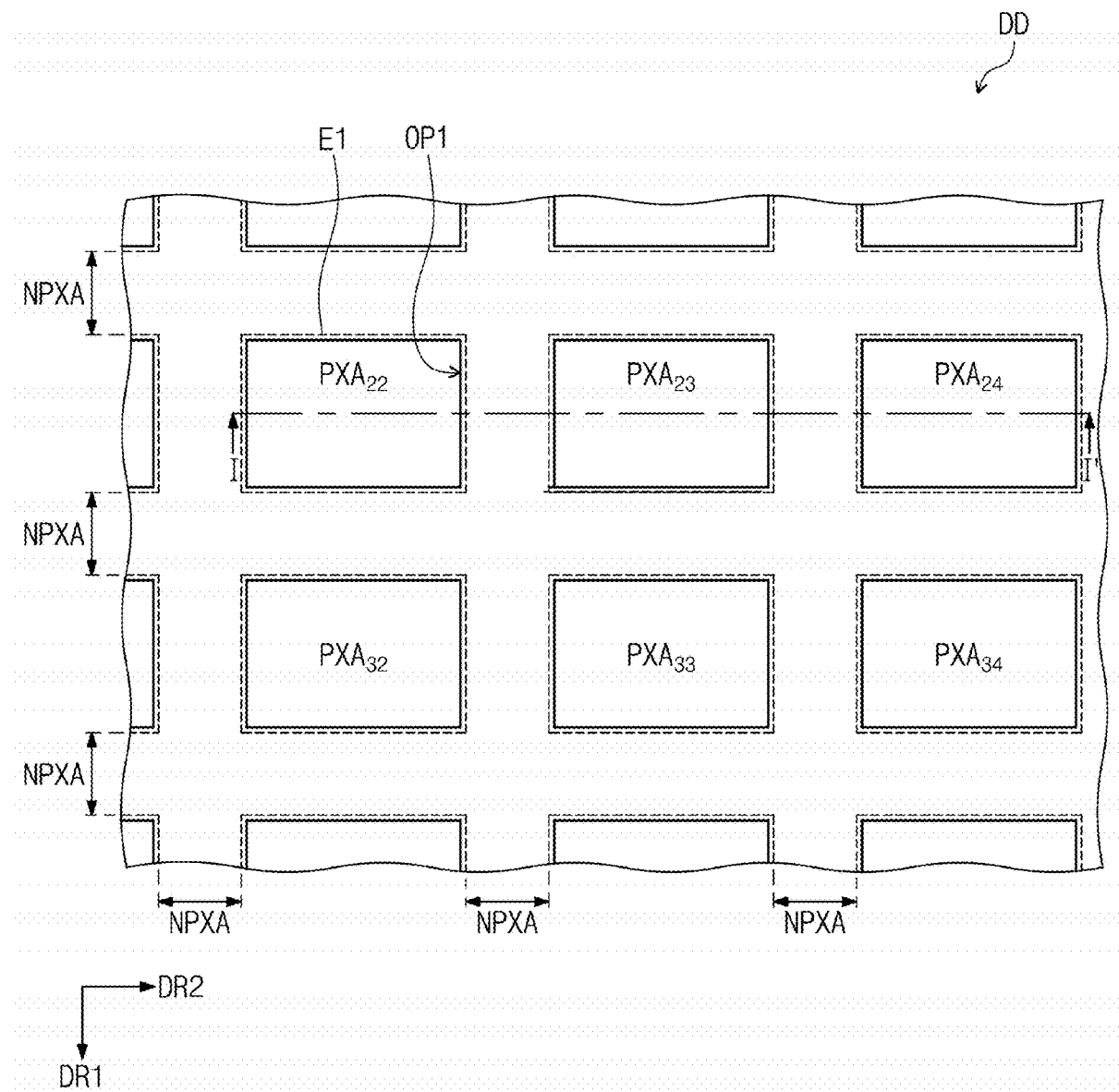
FIG. 3C is a plan view briefly illustrating a portion of a display panel according to an exemplary embodiment.

FIG. 1 is a perspective view illustrating a display device according to an exemplary embodiment. FIG. 2 is a sectional view illustrating a display device according to an exemplary embodiment. FIG. 3A is a block diagram illustrating a display device according to an exemplary embodiment. FIG. 3B is an equivalent circuit diagram of the pixel shown in FIG. 3A. FIG. 3C is a plan view briefly illustrating a portion of a display panel according to an exemplary embodiment. Hereinafter, a display device according to an exemplary embodiment will be described with reference to FIGS. 1, 2, 3A, 3B, and 3C.

Referring to FIG. 1, a display device DD according to an exemplary embodiment may include a display surface DD-IS, which is used to display an image IM. The display surface DD-IS may be defined to be parallel to a first direction DR1 and a second direction DR2. A normal direction of the display surface DD-IS (i.e., a thickness direction of the display device DD) will be referred to as a third direction DR3.

The display device DD, which can be used for a cellphone terminal, is exemplarily illustrated in FIG. 1. Although not shown, the cellphone terminal may further include an electronic module, a camera module, a power module, and so forth, which are mounted on a mainboard and are provided in a bracket or case, along with the display device DD. The display device DD may be used for large-sized electronic devices (e.g., television sets and monitors) or small- or medium-sized electronic devices (e.g., tablets, car navigation systems, game machines, and smart watches).

In an exemplary embodiment, an active region DD-DA may be rectangular or tetragonal. A non-active region DD-NDA may be adjacent to the active region DD-DA. The non-active region DD-NDA may enclose the active region DD-DA. However, the exemplary embodiments are not limited thereto, and in an exemplary embodiment, shapes of the active and non-active regions DD-DA and DD-NDA may be variously changed in a complementary manner. In an exemplary embodiment, the non-active region DD-NDA may be omitted.

Referring to FIG. 2, the display device DD may include a base layer BL, a circuit device layer CL, a display element layer OL, and an encapsulation layer TFE.

The base layer BL may be an underlying layer, on which other elements of the display device DD are disposed. The base layer BL may include a synthetic resin layer. For example, the formation of the base layer BL may include forming a synthetic resin layer on a working substrate, which is used to fabricate the display device DD, forming conductive and insulating layers on the synthetic resin layer, and then removing the working substrate to remain the synthetic resin layer serving as the base layer BL. The synthetic resin layer may be a flexible polyimide-based resin layer. In an exemplary embodiment, the base layer BL may include a rigid glass substrate, a metal substrate, or a substrate made of an organic/inorganic composite material, but the exemplary embodiments are not limited thereto.

The circuit device layer CL may be disposed on the base layer BL. The circuit device layer CL may include at least one insulating layer and a circuit device. The insulating layer included in the circuit device layer CL may include at least one inorganic layer and/or at least one organic layer. The circuit device may include signal lines, pixel driving circuit, and so forth. The formation of the circuit device layer CL may include forming an insulating layer, a semiconductor layer, and a conductive layer using a coating or deposition process and then patterning the insulating layer, the semiconductor layer, and the conductive layer using a photolithography process.

The display element layer OL may be disposed on the circuit device layer CL and may be electrically connected to the circuit device layer CL. The display element layer OL may include an organic light emitting element OD, which will be described with reference to FIG. 4A. The display element layer OL may include an organic layer, which is the same as a pixel definition layer PLE to be described below (e.g., see FIG. 4A).

The encapsulation layer TFE may be disposed on the display element layer OL. The encapsulation layer TFE may cover the display element layer OL and may protect the display element layer OL from external moisture and oxygen. The encapsulation layer TFE may be provided in the form of a thin film including a plurality of inorganic layers and at least one organic layer.

As shown in FIG. 3A, the display device DD may include a timing control unit TC, a gate driving part SD, a data driving part DG, and a pixel region PXP. However, the exemplary embodiments are not limited thereto, and in an exemplary embodiment, at least one of the timing control unit TC, the gate driving part SD, the data driving part DG may be separately provided, independent of the display device DD. In an exemplary embodiment, the timing control unit TC, the gate driving part SD, the data driving part DG, and the pixel region PXP may be formed in the circuit device layer CL.

The timing control unit TC may receive input image signals and output image data IDATA, which are converted to be suitable for an operation mode of the display device DD, and various control signals SCS and DCS.

The gate driving part SD may receive a gate driving control signal SCS from the timing control unit TC. The gate driving part SD may generate a plurality of gate signals, in response to the gate driving control signal SCS. The gate signals may be sequentially output to the display device DD.

The data driving part DG may receive a data driving control signal DCS and the converted image data IDATA from the timing control unit TC. The gate driving part SD may generate a plurality of data signals, based on the data driving control signal DCS and the converted image data IDATA. The data signals may be provided to the display device DD.

The display device DD may display an image in accordance with electrical signals provided from the outside. The display device DD may include a plurality of gate lines SL1-SLn, a plurality of data lines DL1-DLm, and a plurality of pixels PX11-PXnm.

The gate lines SL1-SLn may be arranged in the first direction DR1 and may be extended in the second direction DR2 crossing the first direction DR1. The gate lines SL1-SLn may sequentially receive the gate signals from the gate driving part SD.

The data lines DL1-DLm may be disposed to cross the gate lines SL1-SLn in an electrically separated manner. The data lines DL1-DLm may be arranged in the second direction DR2 and may be extended in the first direction DR1. The data lines DL1-DLm may receive data signals from the gate driving part SD.

The display device DD may receive a first power voltage ELVDD and a second power voltage ELVSS, which are supplied from an external device. Each of the pixels PX11-PXnm may be turned-on in response to a corresponding gate signal. Each of the pixels PX11-PXnm may receive the first power voltage ELVDD and the second power voltage ELVSS and may generate light in response to the corresponding data signal. The first power voltage ELVDD may be higher than the second power voltage ELVSS.

Each of the pixels PX11-PXnm may be connected to a corresponding one of the gate lines SL1-SLn and a corresponding one of the data lines DL1-DLm.

Each of the pixels PX11-PXnm may receive a gate signal from the corresponding gate line and may receive a data signal from the corresponding data line. Each of the pixels PX11-PXnm may be turned-on in response to the corresponding gate signal. Each of the pixels PX11-PXnm may generate light constituting an image, in response to the corresponding data signal.

Each of the pixels PX11-PXnm may include at least one transistor, at least one capacitor, and an organic light emitting element. FIG. 3B illustrates an example of a circuit diagram of a pixel PX, which is connected to one gate line SL of the gate lines SL1-SLn, one data line DL of the data lines DL1-DLm, and a power line PL.

The pixel PX may include a first transistor T1, a second transistor T2, a capacitor Cst, and an organic light emitting element OD. The first transistor T1 may include an input electrode and an output electrode. The first transistor T1 may output a data signal, which is applied to a corresponding one of the data lines DL, in response to a gate signal applied to a gate line GL.

The capacitor Cst may include a first capacitor electrode connected to the first transistor T1 and a second capacitor electrode receiving the first power voltage ELVDD. An amount of electric charges to be stored in the capacitor Cst may be determined by a difference between a voltage corresponding to the data signal, which is received from the first transistor T1, and the first power voltage ELVDD.

The second transistor T2 may include a control electrode, which is connected to the output electrode of the first transistor T1 and the first capacitor electrode of the capacitor Cst, and input electrode, which receives the first power voltage ELVDD provided through the power line PL, and an output electrode. The output electrode of the second transistor T2 may be connected to the organic light emitting element OD.

The second transistor T2 may control a driving current flowing through the organic light emitting element OD, depending on an amount of charges stored in the capacitor Cst. A turn-on time of the second transistor T2 may be determined depending on the amount of charges stored in the capacitor Cst. A voltage, which is supplied to the organic light emitting element OD through the output electrode of the second transistor T2, may be substantially lower than the first power voltage ELVDD.

The organic light emitting element OD may include a first electrode connected to the second transistor T2 and a second electrode receiving the second power voltage ELVSS. The organic light emitting element OD may include a light-emitting pattern disposed between the first electrode and the second electrode.

The organic light emitting element OD may emit light, when the second transistor T2 is in a turn-on period. Color (i.e., wavelength) of light emitted from the organic light emitting element OD may be determined by a material of the light-emitting pattern. For example, the color of light generated by the organic light emitting element OD may be one of red, green, blue, and white.

Referring to FIG. 3C, the display device DD may be sectioned into a plurality of light-emitting regions, through which lights generated from the organic light emitting element OD are emitted, and a non-light-emitting region adjacent to the light-emitting regions. FIG. 3C shows a region including some (e.g., PXA22, PXA23, PXA24, PXA32, PXA33, and PXA34) of the light-emitting regions.

The light-emitting regions PXA22, PXA23, PXA24, PXA32, PXA33, and PXA34 may be spaced apart from each other with a non-light-emitting region NPXA interposed therebetween. The light-emitting regions PXA22, PXA23, PXA24, PXA32, PXA33, and PXA34 may be arranged in various shapes. For example, the light-emitting regions PXA22, PXA23, PXA24, PXA32, PXA33, and PXA34 may be arranged in a matrix shape. Thus, the non-light-emitting region NPXA may have a grid shape. However, the exemplary embodiments are not limited thereto, and in an exemplary embodiment, the arrangement of the light-emitting regions PXA22, PXA23, PXA24, PXA32, PXA33, and PXA34 may be variously changed.

The light-emitting regions PXA22, PXA23, PXA24, PXA32, PXA33, and PXA34 may correspond to a plurality of first openings OP1, which are provided in a pixel definition layer PLE to be described below. In addition, each of the light-emitting regions PXA22, PXA23, PXA24, PXA32, PXA33, and PXA34 may be disposed to be overlapped with a first electrode E1 of an organic light emitting element OD, which will be described with reference to FIG. 4. In FIG. 3C, the first electrode E1, which is overlapped with each of the light-emitting regions PXA22, PXA23, PXA24, PXA32, PXA33, and PXA34, is depicted by a dotted line.

Figure 4A:
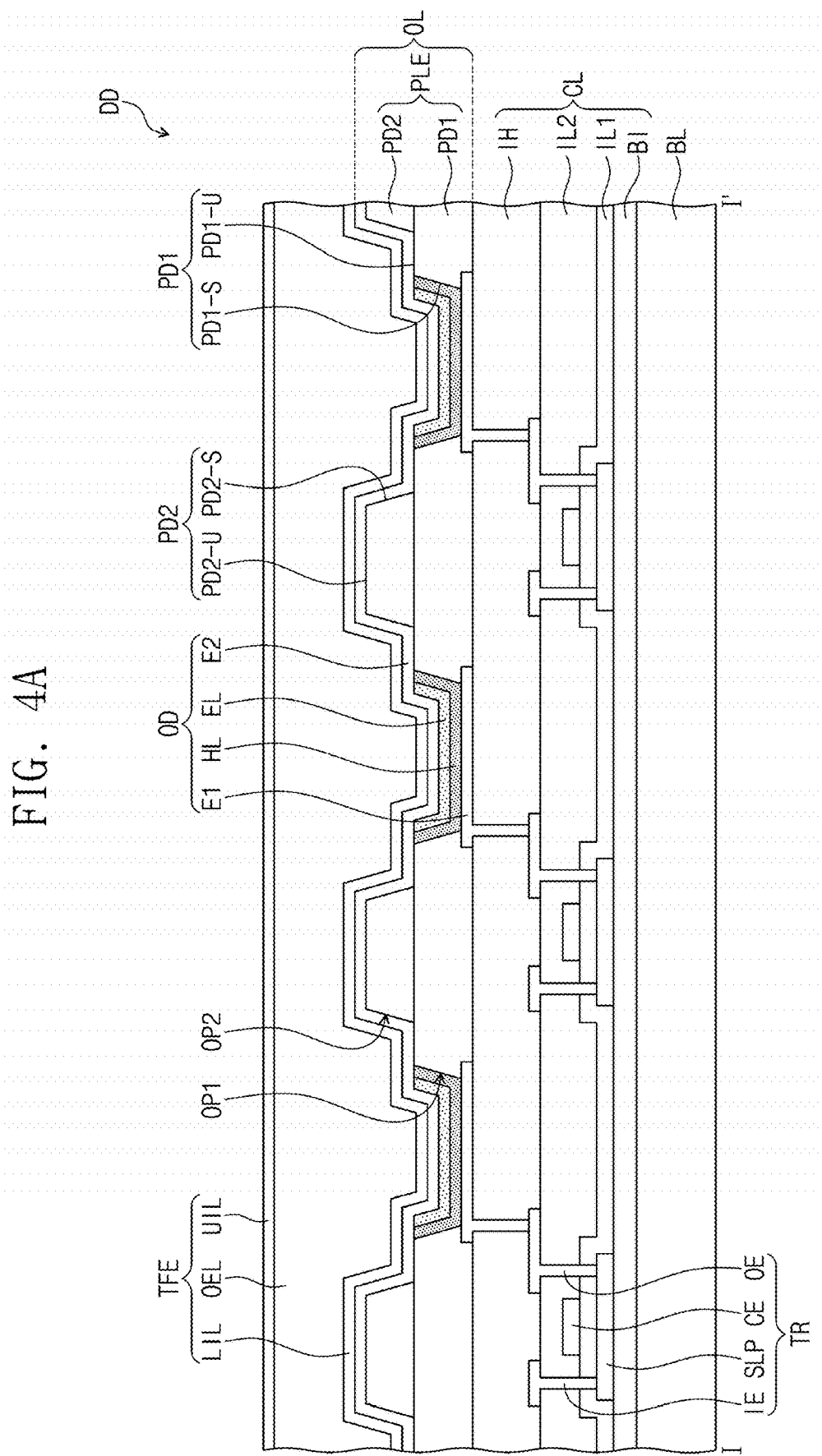
FIG. 4A is a sectional view illustrating a display device according to an exemplary embodiment.
Figure 4B:
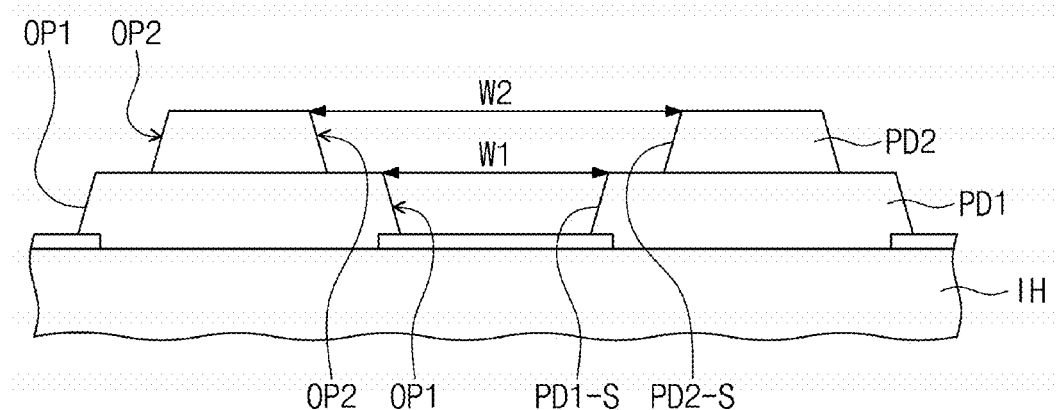
FIG. 4B is an enlarged sectional view illustrating a structure of a display device according to an exemplary embodiment.
Figure 4C:
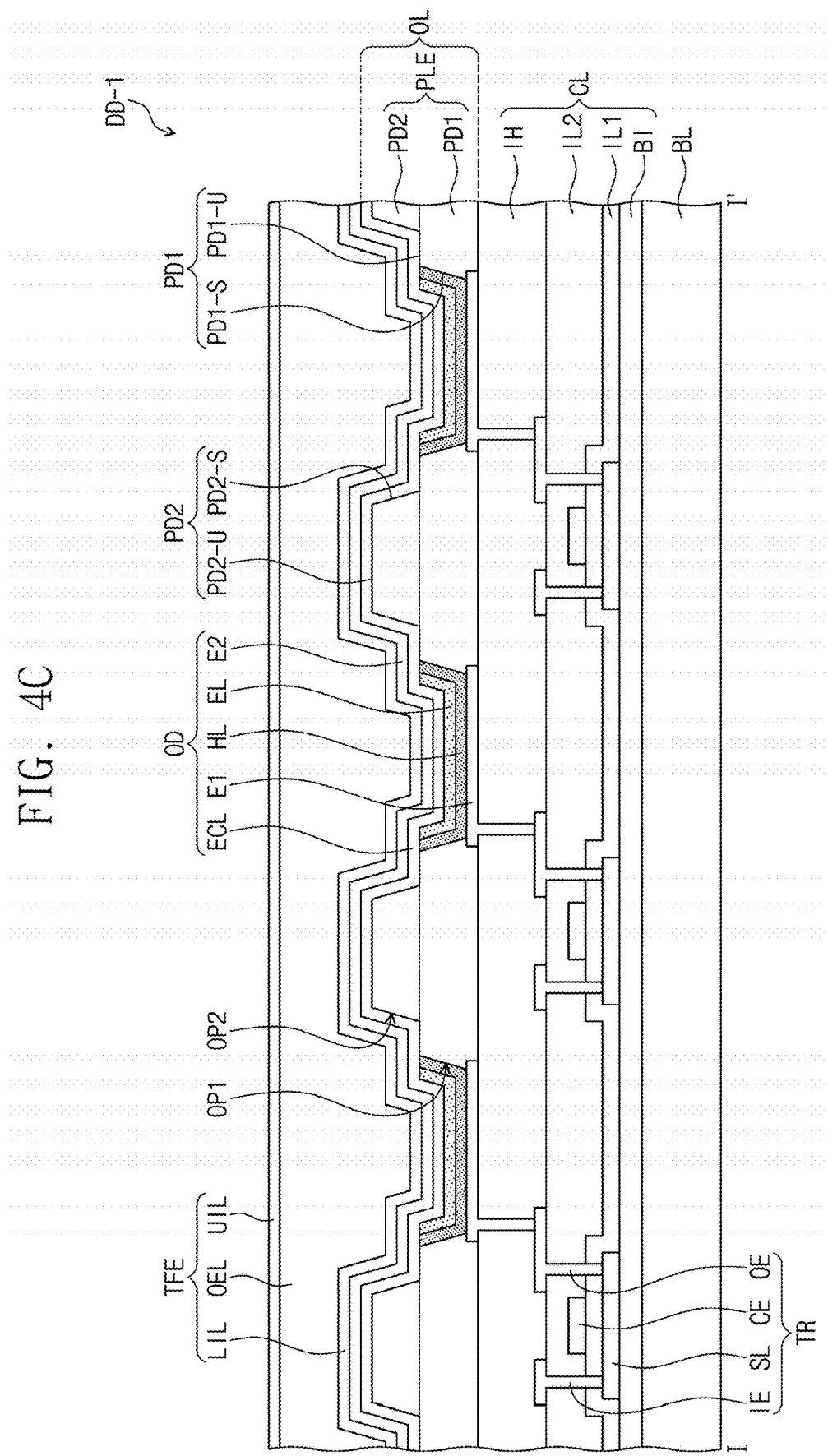
FIG. 4C is a sectional view illustrating a display device according to an exemplary embodiment.

FIG. 4A is a sectional view illustrating a display device according to an exemplary embodiment. FIG. 4B is a sectional view illustrating a display device according to an exemplary embodiment. FIG. 4C is an enlarged sectional view illustrating a structure of a display device according to an exemplary embodiment. FIGS. 5A, 5B, 5C, and 5D are graphs showing a difference in filling ratio of an organic material according to a repellency of a pixel definition layer to the organic material. FIGS. 6A and 6B are plan views showing a change in filling state of an organic material according to a plasma treatment on a pixel definition layer.

Referring to FIG. 4A, the circuit device layer CL may include a transistor TR and plurality of insulating layers BI, IL1, IL2, and IH. The circuit device layer CL may be disposed on the base layer BL.

A barrier layer BI may be disposed on the base layer BL. The barrier layer BI may cover the base layer BL. The barrier layer BI may be an insulating layer including an inorganic material. For example, the barrier layer BI may be formed of or include at least one of aluminum oxide ($AlO_x$), titanium oxide ($TiO_x$), silicon oxide ($SiO_x$), silicon oxynitride ($SiO_xN_y$), zirconium oxide ($ZrO_x$), or hafnium oxide ($HfO_x$). The barrier layer BI may have a multi-layered structure including a plurality of inorganic layers. The barrier layer BI may prevent or suppress an external contamination material from passing therethrough.

Although not shown, the display device DD may further include a buffer layer (not shown). The buffer layer may be disposed on the barrier layer BI. The buffer layer may be formed of or include an inorganic material or an organic material. The buffer layer may be higher than the barrier layer BI, in terms of an adhesion strength to a semiconductor pattern SL or a first insulating layer IL1 to be described below. Thus, the circuit device layer CL may be stably formed on the base layer BL.

The transistor TR may include a semiconductor pattern SL, a control electrode CE, an input electrode IE, and an output electrode OE. The transistor TR may control a flow of electric charges passing through the semiconductor pattern SL in response to an electric signal applied to the control electrode CE. For example, the transistor TR may output an electrical signal from the input electrode IE to the output electrode OE, in response to an electric signal applied to the control electrode CE. The transistor TR shown in FIG. 4A may correspond to one (e.g., the second or driving transistor T2) of the transistors TR1 and TR2 shown in FIG. 3B.

The semiconductor pattern SL may be disposed on the barrier layer BI. The semiconductor pattern SL may include at least one of crystalline semiconductor materials, metal oxide semiconductor materials, poly silicon, or amorphous silicon. The control electrode CE of the transistor TR is illustrated to be disposed on the semiconductor pattern SL, but the exemplary embodiments are not limited thereto. In an exemplary embodiment, the control electrode CE may be disposed on the base layer BL and may be covered with the first insulating layer IL1, and the semiconductor pattern SL may be disposed on the first insulating layer IL1. That is, the transistor TR may have a bottom-gate structure, but the exemplary embodiments are not limited thereto or a specific embodiment.

The first insulating layer IL1 may be disposed between the semiconductor pattern SL and the control electrode CE. The first insulating layer IL1 may cover the base layer BL and the semiconductor pattern SL. The first insulating layer IL1 may be formed of or include an inorganic material, but the exemplary embodiments are not limited thereto.

The control electrode CE may be disposed on the semiconductor pattern SL. The control electrode CE may be spaced apart from the semiconductor pattern SL with the first insulating layer IL1 interposed therebetween. The control electrode CE may be overlapped with the semiconductor pattern SL.

A second insulating layer IL2 may be disposed between the control electrode CE and the input electrode IE and between the control electrode CE and the output electrode OE. The second insulating layer IL2 may cover the first insulating layer IL1 and the control electrode CE. The second insulating layer IL2 may be formed of or include an inorganic material, but the exemplary embodiments are not limited thereto.

The input electrode IE and the output electrode OE may be disposed on the second insulating layer IL2. The input electrode IE and the output electrode OE may penetrate the first insulating layer IL1 and the second insulating layer IL2 and may be coupled to respective portions of the semiconductor pattern SL. However, the exemplary embodiments are not limited thereto, and in an exemplary embodiment, the input electrode IE and the output electrode OE may be directly coupled to the semiconductor pattern SL.

A third insulating layer IH may be disposed on the second insulating layer IL2. The third insulating layer IH may cover the transistor TR. The third insulating layer IH may be disposed between the transistor TR and the display element layer OL to electrically disconnect the transistor TR and the display element layer OL from each other.

The display element layer OL may include a pixel definition layer PLE, and the organic light emitting element OD.

The organic light emitting element OD may include a first electrode E1, a second electrode E2, a hole control layer HL, and an organic light emitting layer EL. The organic light emitting element OD may be overlapped with the active region DD-DA. The organic light emitting element OD according to an exemplary embodiment may be defined to include at least one of the organic light emitting layer EL and the hole control layer HL.

The first electrode E1 may be disposed on the third insulating layer IH. The first electrode E1 may penetrate the third insulating layer IH and may be electrically connected to the transistor TR. In an exemplary embodiment, a plurality of the first electrodes E1 may be provided. Each of the plurality of the first electrodes E1 may be disposed to be overlapped with a corresponding one of the light-emitting regions PXA22, PXA23, PXA24, PXA32, PXA33, and PXA34 described with reference to FIG. 3C.

The second electrode E2 may be disposed on the first electrode E1. The second electrode E2 may be disposed to face the first electrode E1. The second electrode E2 may be disposed to be overlapped with the plurality of first electrodes E1 and the pixel definition layer PLE. For example, the second electrode E2 may cover a second pixel definition layer PD2, a top surface PD1-U of a first pixel definition layer PD1, and the organic light emitting layer EL. The second electrode E2 may have a single object structure, which is disposed on the entire top surface of the base layer BL.

The second electrode E2 may include a transmissive electrode, which is optically transparent. For example, the second electrode E2 may be formed of or include at least one of indium zinc oxide (IZO), indium tin oxide (ITO), indium gallium oxide (IGO), indium zinc gallium oxide (IGZO), mixtures thereof, or compounds thereof. Thus, an image may be displayed on the front surface of the display device DD. However, the exemplary embodiments are not limited thereto, and in an exemplary embodiment, the second electrode E2 may include a reflective or transflective electrode, depending on a display direction of an image.

The organic light emitting layer EL may be disposed between the first electrode E1 and the second electrode E2. In an exemplary embodiment, a plurality of the organic light emitting layers EL may be provided to be overlapped with the first electrodes, respectively. Depending on a potential difference between the first electrode E1 and the second electrode E2, the organic light emitting element OD may activate the organic light emitting layer EL and generate light.

In an exemplary embodiment, the organic light emitting layer EL may include a low molecular organic material or a polymer organic material. For example, the organic light emitting layer EL emitting a red light may include tetraphenylnaphthacene (rubrene), tris(1-phenylisoquinoline) iridium(III) (Ir(piq)3), bis(2-benzo[b]thiophene-2-yl-pyridine) (acetylacetonate)iridium(III) (Ir(btp)2(acac)), tris(dibenzoyl)phenanthroline europium (III) (Eu(dbm)3(phen)), tris[4,4'-di-tert-butyl-(2,2')-bipyridine]ruthenium(III)complex (Ru (dtb-bpy)3*2(PF6)), DCM1, DCM2, Eu(thenoyltrifluoroacetone)3 (Eu(TTA)3, butyl-6-(1,1,7,7-tetramethyljulolidyl-9-enyl)-4H-pyran (DCJTB), or other polymeric light-emitting materials, such as polyfluorene polymers and polyvinyl polymers.

The organic light emitting layer EL emitting a green light may include green light-emitting materials including 3-(2-benzothiazolyl)-7-(diethylamino)coumarin (Coumarin 6) 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), tris(2-phenylpyridine)iridium(III) (Ir(ppy)3), or other polymeric light-emitting materials, such as polyfluorene polymers and polyvinyl polymers.

In an exemplary embodiment the organic light emitting layer EL emitting a blue light may include blue light-emitting materials including oxadiazole dimer dyes (Bis-DAPOXP), spiro compounds (Spiro-DPVBi, Spiro-6P), triarylamine compounds, bis(styryl)amine) (DPVBi, DSA), 4,4'-bis(9-ethyl-3-carbazovinylen)-1,1'-biphenyl (BCzVBi), perylene, 2,5,8,11-tetra-tert-butylperylene (TPBe), 9H-carbazole-3,3'-(1,4-phenylene-di-2,1-ethene-diyl)bis[9-ethyl-(9C)](BCzVB), 4,4-bis[4-(di-p-tolylamino)styryl]biphenyl (DPAVBi), 4-(di-p-tolylamino)-4'-[(di-p-tolylamino)styryl] stilbene (DPAVB), 4,4'-bis[4-(diphenylamino)styryl]biphenyl (BDAVBi), bis(3,5-difluoro-2-(2-pyridyl)phenyl-(2-carboxypyridyl)iridium III(FIrPic), or other polymeric light-emitting materials, such as polyfluorene polymers or polyvinyl polymers.

In the case where the organic light emitting layer EL includes a low molecular organic material, the organic light emitting layer EL may further include the electron control layer. The electron control layer may include an electron transport layer and an electron injection layer.

In an exemplary embodiment, a plurality of electron control layers may be provided. Each of the electron control layers may be provided on a corresponding one of the light-emitting regions (e.g., see FIG. 3C) by an inkjet printing method. Thus, the electron control layer may be sectioned by the grid-shaped non-light-emitting regions (e.g., see FIG. 3C).

The hole control layer HL may be disposed between the first electrode E1 and the organic light emitting layer EL. The hole control layer HL may include a hole injection layer and a hole transport layer.

The hole control layer HL may have a single-layered structure, which has one of the hole injection layer and the hole transport layer or contains both of a hole injection material and a hole transportation material. Alternatively, the hole control layer HL may have a single-layered structure, which is formed of a plurality of different materials, or a structure of hole injection layer/hole transport layer, of hole injection layer/hole transport layer/hole buffer layer, of hole injection layer/hole buffer layer, of hole transport layer/hole buffer layer, or of hole injection layer/hole transport layer/electron blocking layer, which are sequentially stacked on the first electrode E1, but the exemplary embodiments are not limited thereto.

The hole control layer HL may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

For example, the hole injection layer may include phthalocyanine compounds (such as copper phthalocyanine), DNTPD(N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris(N,N-diphenylamino)triphenylamine), 2-TNATA(4,4',4"-tris {N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), PANI/PSS((Polyaniline)/Poly(4-styrenesulfonate)), NPB(N,N'-di(naphthalene-1-yl)-N,N'-diphenyl-benzidine), polyether ketone(TPAPEK) containing triphenylamine, 4-Isopropyl-4'-methyldiphenyliodonium Tetrakis(pentafluorophenyl)borate, or HAT-CN(dipyrazino[2,3-f: 2',3'-h] quinoxaline-2,3,6,7,10,11-hexacarbonitrile).

The hole transport layer may include, for example, carbazole derivatives (such as N-phenylcarbazole or polyvinylcarbazole), fluorine derivatives, triphenylamine derivatives (such as TPD(N,N'-bis(3-methylphenyl)-N,N'-diphenyl-[1,1-biphenyl]-4,4'-diamine) or TCTA(4,4',4"-tris(N-carbazolyl)triphenylamine)), NPB(N,N'-di(naphthalene-1-yl)-N,N'-diphenyl-benzidine), TAPC(4,4'-Cyclohexylidene bis[N,N-bis(4-methylphenyl)benzenamine]), HMTPD(4,4'-Bis[N,N'-(3-tolyl)amino]-3,3'-dimethylbiphenyl), or mCP(1,3-Bis (N-carbazolyl)benzene).

As described above, the hole control layer HL may further include a hole buffer layer and an electron blocking layer, in addition to the hole injection layer and the hole transport layer.

The hole buffer layer may compensate a resonance distance, which varies depending on the wavelength of light emitted from the organic light emitting layer EL, and thus, the hole buffer layer may contribute to increase light emission efficiency. The hole buffer layer may be formed of or include a material, which can be contained in the hole control layer HL. The electron blocking layer may prevent or suppress electrons from being injected from the electron transport region into the hole transport region.

In an exemplary embodiment, the organic light emitting layer EL may include a material containing a quantum dot. The core of the quantum dot may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPb-STe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle. In an exemplary embodiment, the quantum dot may have a core-shell structure, which includes a core containing the afore-described nanocrystal and a shell surrounding the core. At an interface between the core and the shell, an element contained in the shell may have a concentration gradient decreasing in a central direction.

In certain exemplary embodiments, each of the quantum dots may have a core/shell structure, in which one quantum dot is enclosed by another quantum dot. The shell of the quantum dot may be used as a protection layer, which prevents or suppresses chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction. For example, the shell of the quantum dot may be formed of or include oxide compounds of metallic or nonmetallic elements, semiconductor compounds, or any combination thereof.

For example, the oxide compounds of metallic or nonmetallic elements for the shell may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$) and ternary compounds (e.g., $MgAl_2O_4$, $CoFe_2O_4$, $NiFe_2O_4$, and $CoMn_2O_4$), but the exemplary embodiments are not limited thereto.

In addition, the semiconductor compounds for the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the exemplary embodiments are not limited thereto.

Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, the quantum dots may allow light to be emitted radially, and thus, it may be possible to improve a viewing angle property.

In an exemplary embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the exemplary embodiments are not limited thereto.

A wavelength or color of light emitted from the quantum dot may be determined by a particle size of the quantum dot, and by providing quantum dots of various sizes, it may be possible to realize various colors (e.g., blue, red, and green).

The encapsulation layer TFE may be disposed on the organic light emitting element OD. In the present embodiment, the encapsulation layer TFE may include a first inorganic encapsulation layer LIL, an organic encapsulation layer OEL, and a second inorganic encapsulation layer UIL.

The first inorganic encapsulation layer LL may be disposed on the display element layer OL. The first inorganic encapsulation layer LL may be disposed on the entire top surface of the base layer BL to cover the second electrode E2. The second inorganic encapsulation layer UIL may be disposed on the first inorganic encapsulation layer LIL. The first inorganic encapsulation layer LIL and the second inorganic encapsulation layer UIL may seal or encapsulate the organic encapsulation layer OEL. Each of the first inorganic encapsulation layer LIL and the second inorganic encapsulation layer UIL may be formed of or include an inorganic material. For example, each of the first inorganic encapsulation layer LIL and the second inorganic encapsulation layer UIL may be formed of or include at least one of aluminum oxide ($AlO_x$), silicon oxide ($SiO_x$), silicon nitride ($SiN_x$), silicon oxynitride ($SiO_xN_y$), silicon carbide ($SiC_x$), titanium oxide ($TiO_x$), zirconium oxide ($ZrO_x$), or zinc oxide ($ZnO_x$).

The organic encapsulation layer OEL may be disposed between the first inorganic encapsulation layer LIL and the second inorganic encapsulation layer UIL. The organic encapsulation layer OEL may be formed of or include an organic material. For example, the organic encapsulation layer OEL may be formed of or include at least one of epoxy, polyimide, polyethylene terephthalate, polycarbonate, polyethylene, or polyacrylate.

In a plan view, each of the first inorganic encapsulation layer LIL and the second inorganic encapsulation layer UIL may be a single structure that is disposed on the entire top surface of the display device DD. Each of the first inorganic encapsulation layer LIL and the second inorganic encapsulation layer UIL may be partially overlapped with the organic encapsulation layer OEL. Thus, in some regions, the first inorganic encapsulation layer LIL and the second inorganic encapsulation layer UIL may be spaced apart from each other in the third direction DR3 with the organic encapsulation layer OEL interposed therebetween, whereas in other regions, the first inorganic encapsulation layer LL and the second inorganic encapsulation layer UIL may be in direct contact with each other in the third direction DR3. The encapsulation layer TFE may hermetically seal the organic light emitting element OD and may protect the organic light emitting element OD from an external contamination material.

According to an exemplary embodiment, the pixel definition layer PLE may include the first pixel definition layer PD1 and the second pixel definition layer PD2.

The first pixel definition layer PD1 may be disposed on the third insulating layer IH. The first pixel definition layer PD1 may be formed to define a first opening OP1. For example, the first opening OP1 may be formed to penetrate the first pixel definition layer PD1, and in this case, the first opening OP1 may be define by a first side surface PD1-S of the first pixel definition layer PD1.

In an exemplary embodiment, the first side surface PD1-S may be inclined to have an ascent shape in a direction from the first electrode E1 toward the first top surface PD1-U of the first pixel definition layer PD1. For example, the first opening OP1 may have a trapezoidal section. However, the exemplary embodiments are not limited thereto, and in an exemplary embodiment, the first side surface PD1-S may be perpendicular to the first electrode E1 and the first top surface PD1-U.

The first opening OP1 may expose at least a portion of the first electrode E1. In an exemplary embodiment, a plurality of the first openings OP1 may be provided to be overlapped with the first electrodes, respectively. The plurality of the first openings OP1 may substantially correspond to the light-emitting regions PXA22, PXA23, PXA24, PXA32, PXA33, and PXA34 described with reference to FIG. 3C.

In an exemplary embodiment, the first top surface PD1-U of the first pixel definition layer PD1 may be exposed from the organic layer (e.g., one of the hole control layer HL and the organic light emitting layer EL).

In the case where the organic layer is formed by an inkjet printing process, the formation of the organic layer may include filling the first opening OP1 with an organic material and performing a drying or bake process or the like to form an organic layer of a desired thickness.

Here, the first pixel definition layer PD1 may have a repellency to an organic material, and in this case, the organic material may be formed to fill only the first opening OP1. Accordingly, the organic layer, which is formed of an organic material, may be locally disposed in the first opening OP1 or may be disposed to be in contact with only the first electrode E1 and the first side surface PD1-S and to expose the first top surface PD1-U. A process of forming the organic layer will be described in more detail below.

The second pixel definition layer PD2 may be disposed on the top surface PD1-U of the first pixel definition layer PD1. The second pixel definition layer PD2 may be provided to define a second opening OP2. For example, the second opening OP2 may be formed to penetrate the second pixel definition layer PD2, and in this case, the second opening OP2 may be defined by a second side surface PD2-S of the second pixel definition layer PD2.

In an exemplary embodiment, the second side surface PD1-S may be inclined to have an ascent shape in a direction from the first top surface PD1-U of the first pixel definition layer PD1 toward a second top surface PD2-U of the second pixel definition layer PD2. However, the exemplary embodiments are not limited thereto, and in an exemplary embodiment, the second side surface PD2-S may be perpendicular to the first top surface PD1-U and the second top surface PD2-U.

The second opening OP2 may be overlapped with the first opening OP1. In an exemplary embodiment, a plurality of the second openings OP2 may be provided to be overlapped with respective ones of the first openings.

In an exemplary embodiment, the second pixel definition layer PD2 may be spaced apart from each other the organic layer. The second pixel definition layer PD2 may have a repellency to an organic material, which is used to form the organic layer (e.g., one of the hole control layer HL and the organic light emitting layer EL). Thus, the organic layer may be locally disposed in only the first opening OP1, and the second pixel definition layer PD2 may be spaced apart from each the organic layer.

Referring to FIG. 4B, when viewed in a specific direction in a sectional view, a first width W1 of the first opening OP1 may be smaller than a second width W2 of the second opening OP2.

The first width W1 may be the largest width of the first opening OP1, which is to defined by the first side surface PD1-S that is an inclined surface, and the second width W2 may be the largest width of the second opening OP2, which is defined by the second side surface PD2-S that is an inclined surface.

The first pixel definition layer PD1 may have a first repellency to an organic material, which is used for an organic layer (e.g., one of the hole control layer HL and the organic light emitting layer EL). The second pixel definition layer PD2 may have a second repellency to an organic material, which is used for an organic layer (e.g., one of the hole control layer HL and the organic light emitting layer EL). The liquid repellent properties of the pixel definition layers PD1 and PD2 may be achieved by coating liquid repellent materials. For example, the liquid repellent properties of the pixel definition layers PD1 and PD2 may be achieved by coating a fluorine containing material on the pixel definition layers PD1 and PD2 and performing a bake process to agglutinate fluorine elements on outer surfaces of the pixel definition layers PD1 and PD2. In an exemplary embodiment, the second repellency may be greater than the first repellency.

A difference between the first repellency and the second repellency may be achieved by performing a plasma treatment process on the first pixel definition layer PD1. In an exemplary embodiment, a residual material remaining on the first electrode E1 may lead to deterioration in reliability of the organic light emitting element OD. After a photolithography process for forming the first pixel definition layer PD1, a plasma treatment process may be performed to remove a residual material remaining on the first electrode E1. After the plasma treatment process, the first repellency of the first pixel definition layer PD1 may be weakened. The plasma treatment process may lead to a reduction in bonding strength between the agglutinated fluorine elements and the outer surface of the first pixel definition layer PD1 and the consequent decoupling between the fluorine elements and the first pixel definition layer PD1, and this may lead to deterioration of the first repellency of the first pixel definition layer PD1.

In the case where the first pixel definition layer PD1 and the second pixel definition layer PD2 include the same liquid repellent material, the second repellency of the second pixel definition layer PD2 may have a larger value than that of the first repellency of the first pixel definition layer PD1, to which the plasma treatment has been performed.

Owing to the difference between the liquid repellent properties, in the case where the openings OP1 and OP2 of the pixel definition layers PD1 and PD2 are filled with an organic material provided by a printing method, the organic material may not cover the second pixel definition layer PD2, whose repellency to the organic material is relatively greater than the repellency of the first pixel definition layer PD1 to the organic material. Thus, by increasing the heights of the pixel definition layers PD1 and PD2, it may be possible to increase filling ratios of the organic material in the openings OP1 and OP2, and due to the difference in repellency to the organic material, it may be possible to form the organic layer in the desired opening (e.g., the first opening OP1 of the first pixel definition layer PD1).

In an exemplary embodiment, the organic layer of the organic light emitting element OD may be formed by an inkjet printing process. An organic material, which is used for the organic layer, may be provided to fill the openings OP1 and OP2 defined in the pixel definition layer PLE, and the organic layer may be formed by performing a drying and bake process on the organic material.

According to an exemplary embodiment, since the pixel definition layers PD1 and PD2 have the liquid repellent properties, it may be possible to prevent or suppress the organic material from being coated on an unnecessary region in the inkjet printing process and to improve efficiency in the filling process of the organic material.

In addition, the second pixel definition layer PD2 may be disposed on the first pixel definition layer PD1 to compensate the reduction of the repellency of the first pixel definition layer PD1 to the organic material caused by the plasma treatment process, and it may be possible to realize the organic light emitting element OD with improved reliability, using a desired amount of the organic material.

Figure 5A:
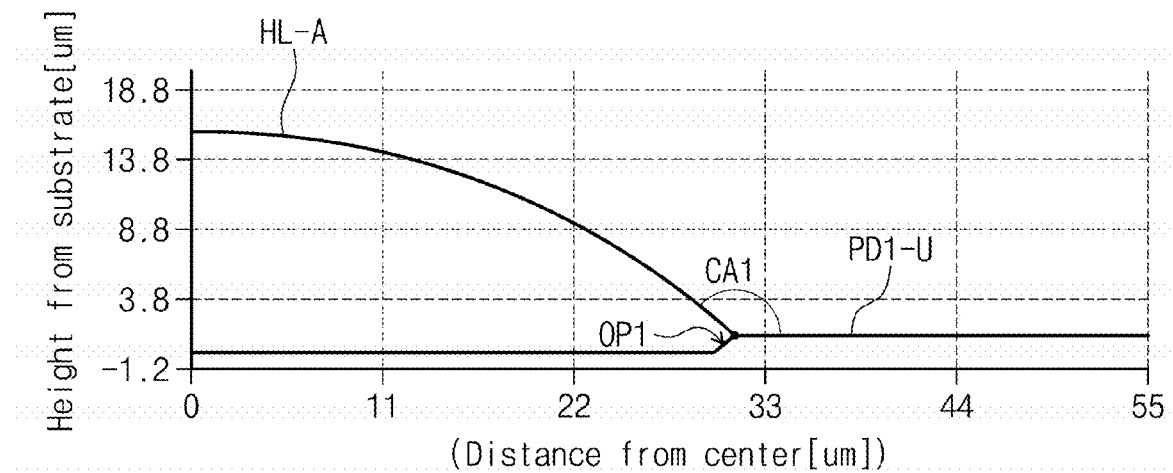
FIGS. 5A, 5B, 5C, and 5D are graphs showing a difference in filling ratio of an organic material according to a repellency of a pixel definition layer to the organic material.
Figure 5B:
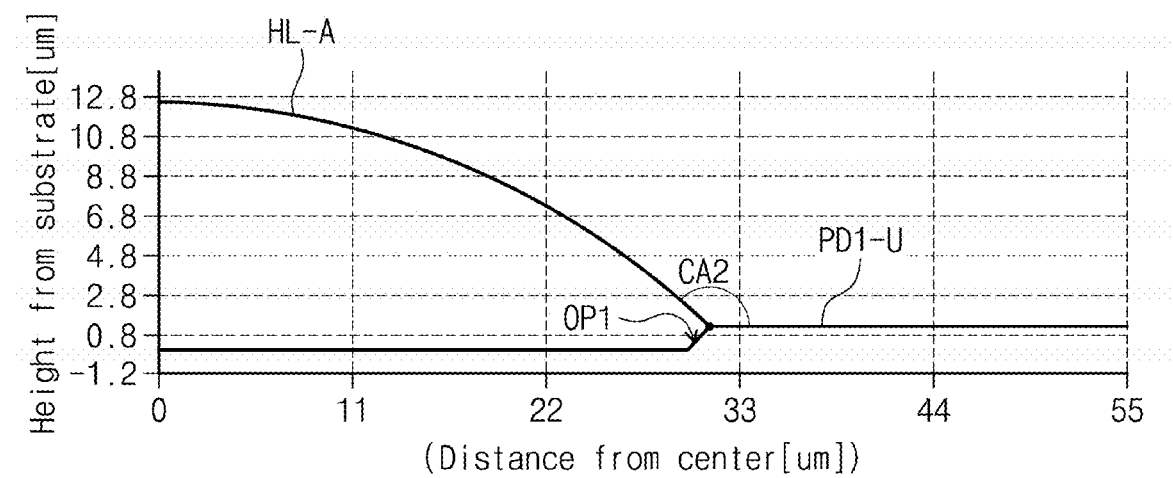
Figure 5C:
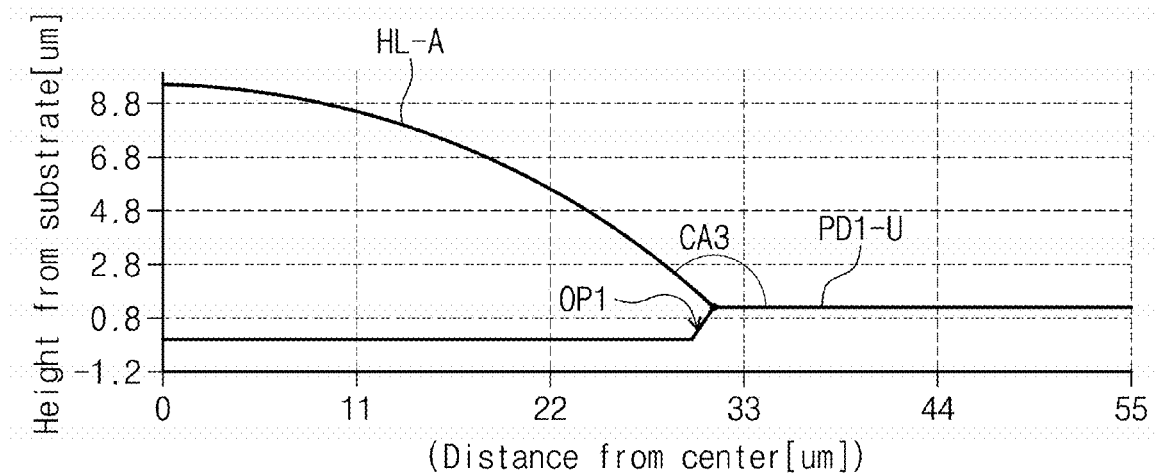
Figure 5D:
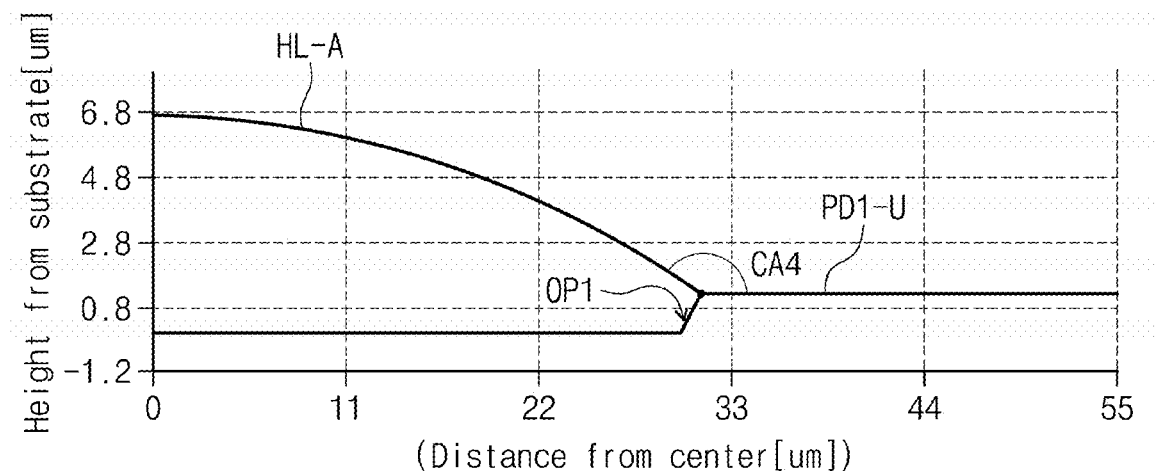
Figure 6A:
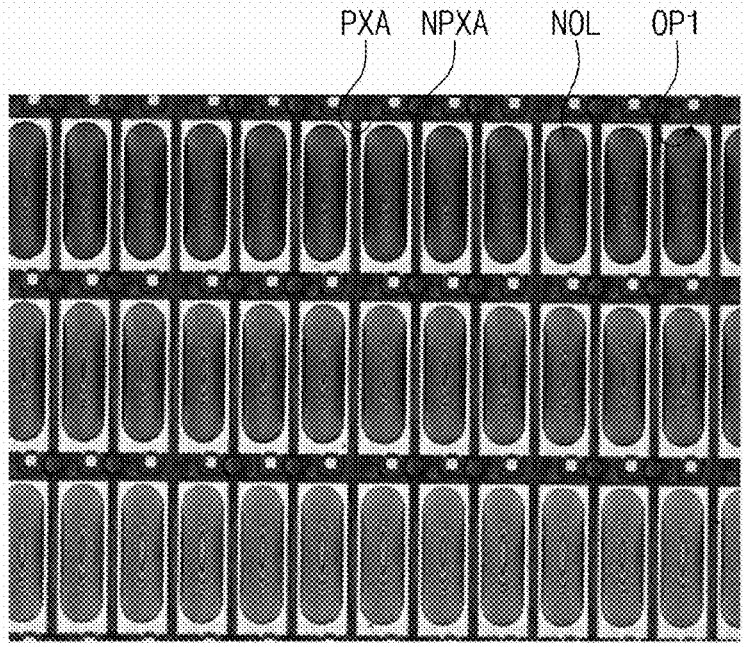
FIGS. 6A and 6B are plan views showing a change in filling state of an organic material according to a plasma treatment on a pixel definition layer.
Figure 6B:
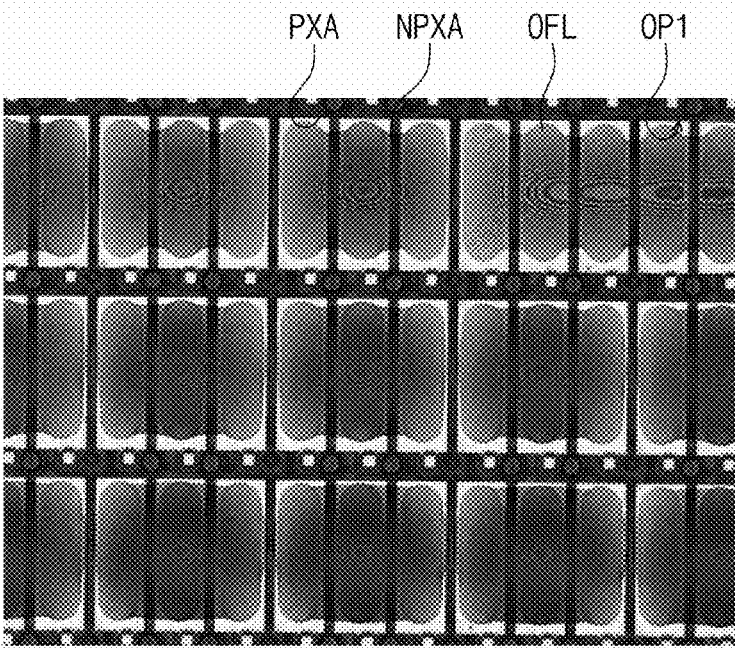

FIG. 5A is a graph showing a contact angle CA1, which is obtained when the plasma treatment process is not performed on the first pixel definition layer PD1. FIGS. 5B, 5C, and 5D are graphs showing contact angles CA2, CA3, and CA4, which are obtained when the plasma treatment process is performed to remove residual materials remaining on the first electrode E1 after the formation of the first pixel definition layer PD1. Hereinafter, the plasma treatment on the first pixel definition layer PD1 and the reduction of its repellency to the organic material will be described with reference to FIGS. 5A, 5B, 5C, and 5D and Table 1.

TABLE 1

|  | Maximum Filling Amount |
|---|---|
| Comparative Example | 84 pL (picoliter) |
| First Experimental Example | 66 pL |
| Second Experimental Example | 51 pL |
| Third Experimental Example | 36 pL |

In Table 1, the maximum filling amount represents an amount of an organic material capable of filling the first opening OP1, and this amount may vary depending on a contact angle.

The contact angle in the comparative example was measured from an organic material HL-A, which was formed to fill the first opening OP1, without the plasma treatment on the first pixel definition layer PD1. Here, the contact angle represents an angle between the top surface PD1-U of the first pixel definition layer PD1 and the organic material HL-A filing the first opening OP1.

The contact angle in the comparative example may correspond to the first contact angle CA1 of FIG. 5A. When the first contact angle CA1 was 50°, the maximum filling amount of the organic material HL-A filling the first opening OP1 was 84 pL.

Each of the contact angles in the first, second, and third experimental examples was measured the organic material HL-A, which was formed to fill the first opening OP1, after the plasma treatment.

The contact angle in the first experimental example may correspond to the second contact angle CA2 shown in FIG. 5B. When the second contact angle CA2 was 40°, the maximum filling amount of the organic material HL-A filling the first opening OP1 was 66 pL.

The contact angle in the second experimental example may correspond to the third contact angle CA3 shown in FIG. 5C. When the third contact angle CA3 was 30°, the maximum filling amount of the organic material HL-A filling the first opening OP1 was 51 pL.

The contact angle in the third experimental example may correspond to the fourth contact angle CA4 shown in FIG. 5D. The fourth contact angle CA4 was 20°, the maximum filling amount of the organic material HL-A filling the first opening OP1 was 36 pL.

As seen from the first to third experimental examples, the increase of the contact angle may increase an amount of an organic material filling the opening. Since the filling amount is increased, it may be possible to form an organic layer of a desired thickness and thereby to provide a display device with improved reliability.

In the case where the plasma treatment was performed on the first pixel definition layer PD1 as in the experimental examples, the contact angle was lower than that in the comparative example, in which the plasma treatment was not performed, and the maximum filling amount of the organic material HL-A filling the first opening OP1 was decreased with decreasing of the contact angle.

The image of FIG. 6A was obtained when an organic layer was formed on the first pixel definition layer PD1, to which the plasma treatment was not performed, and the image of FIG. 6B was obtained when an organic layer was formed on the first pixel definition layer PD1, to which the plasma treatment was performed. Amounts of the supplied organic materials was the same, in the two experiments.

Referring to FIG. 6A, a comparative organic layer NOL was formed on the first pixel definition layer PD1, to which the plasma treatment was not performed, and the comparative organic layer NOL was not overlapped with the non-light-emitting region NPXA. By contrast, an experimental organic layer OFL was formed on the first pixel definition layer PD1, to which the plasma treatment was performed, and a portion of the experimental organic layer OFL was overlapped with the non-light-emitting region NPXA. This overlapping may be caused by the deterioration of the repellency to the organic material caused by the plasma treatment PD1. That is, a portion of the organic material overflown outside the first opening OP1 may be the portion of the experimental organic layer OFL overlapped with the non-light-emitting region NPXA.

In the case where the organic layer of the organic light emitting element OD is formed by the printing process, in order to improve reliability of the organic light emitting element OD, it is necessary to perform the plasma treatment for removing a residual material from the first electrode E1. However, the plasma treatment may lead to deterioration in the repellency of the first pixel definition layer PD1 to the organic material. Thus, in the case where the organic material for filling the first opening OP1 is formed in a desired amount, the organic material may be overflown onto the non-light-emitting region NPXA.

By contrast, according to an exemplary embodiment, the second pixel definition layer PD2 may be disposed on the first pixel definition layer PD1 to compensate the deterioration of the of the first pixel definition layer PD1 to the organic material caused by the plasma treatment. Thus, even when a desired amount of an organic material is used, it may be possible to provide the organic light emitting element OD with improved reliability.

Referring to FIG. 4C, a display device DD-1 according to an exemplary embodiment may further include an electron control layer ECL, unlike FIG. 4A. In an exemplary embodiment, the hole control layer HL and the organic light emitting layer EL may be formed in the first opening OP1 by an inkjet printing process, and the electron control layer ECL may be formed on the entire top surface of the base layer BL by a deposition process. For example, the hole control layer HL may be formed to cover the first pixel definition layer PD1 and the organic layer (e.g., one of the hole control layer HL and the organic light emitting layer EL). The electron control layer ECL may include the electron transport layer and the electron injection layer, which are included in the organic light emitting layer EL described with reference to FIG. 4A.

FIGS. 7A, 7B, 7C, 7D, 7E, 7F, 7G, 7H, 7I, and 7J are sectional views illustrating a method of fabricating a display device according to an exemplary embodiment. In the following description, the same element as that of FIGS. 1, 2, 3A, 3B, 3C, 4A, and 4B will be identified by the same or similar reference number without repeating an overlapping description thereof. Hereinafter, a method of fabricating a display device according to an exemplary embodiment will be described with reference to FIGS. 7A, 7B, 7C, 7D, 7E, 7F, 7G, 7H, 7I, and 7J.

Referring to FIG. 7A, a method of fabricating a display device according to an exemplary embodiment may include forming a preliminary first pixel definition layer PD1-A. The preliminary first pixel definition layer PD1-A may be formed on a base substrate SB provided with the first electrode E1. In an exemplary embodiment, the base substrate SB may be a structure including the base layer BL and the circuit device layer CL described with reference to FIG. 4A. In an exemplary embodiment, the preliminary first pixel definition layer PD1-A may have a repellency to a specific organic material. The organic material may be one of a first organic material HL-A and a second organic material HL-B to be described below.

Referring to FIG. 7B, the method may include forming the first pixel definition layer PD1. The first pixel definition layer PD1 may be formed by forming the first opening OP1 in the preliminary first pixel definition layer PD1-A.

The first opening OP1 may be formed by performing a photolithography process on the preliminary first pixel definition layer PD1-A. The photolithography process for forming the first opening OP1 may be performed using a first mask MS1. The first opening OP1 may be formed to penetrate the preliminary first pixel definition layer PD1-A and to expose the first electrode E1.

In an exemplary embodiment, in the photolithography process for forming the first pixel definition layer PD1, an unremoved material (hereinafter, a residue PD1-P) of the preliminary first pixel definition layer PD1-A may remain on the first electrode E1. The residue PD1-P may lead to deterioration in reliability of the organic light emitting element OD (e.g., of FIG. 4A).

Referring to FIG. 7C, the method may include performing a plasma treatment PT on the first pixel definition layer PD1. The plasma treatment PT may be performed to remove the residue PD1-P from a top surface E1-U of the first electrode E1. By performing the plasma treatment PT, it may be possible to improve reliability of the organic light emitting element OD.

However, in the case where the plasma treatment PT is performed on the first pixel definition layer PD1, the repellency of the first pixel definition layer PD1 to the organic material may be deteriorated. For example, in the case where the preliminary first pixel definition layer PD1-A has an initial repellency to a specific organic material (e.g., a first material) and the first pixel definition layer PD1 after the plasma treatment PT has a first repellency to the organic material (i.e., the first material), the first repellency may be defined as a property deteriorated from the initial repellency to the organic material by the plasma treatment PT.

The deterioration of the repellency of the first pixel definition layer PD1 to the organic material may cause an over flow issue, in which an organic material is over-flown onto the top surface PD1-U of the first pixel definition layer PD1 when the organic material for the organic layer is formed by a printing process.

Referring to FIGS. 7D and 7E, the method may include forming a preliminary organic layer HL1. The preliminary organic layer HL1 may be formed by an inkjet printing process. For example, the formation of the preliminary organic layer may include proving the first organic material HL-A in the first opening OP1 to expose the first top surface PD1-U and drying the first organic material HL-A.

In an exemplary embodiment, the first top surface PD1-U may be exposed from the first organic material HL-A. In other words, the first organic material HL-A may not be over-flown onto the first top surface PD1-U. Although the repellency of the first pixel definition layer PD1 is deteriorated by the plasma treatment PT, the overflow of the first organic material HL-A may be prevented or suppressed by filling the first organic material HL-A in consideration of the largest filling ratio of the first pixel definition layer PD1.

The preliminary organic layer HL1 may be formed by removing an organic solvent from the first organic material HL-A.

In an exemplary embodiment, the first top surface PD1-U may be exposed from the preliminary organic layer HL1. Due to the repellency of the first pixel definition layer PD1 to the first organic material HL-A, the preliminary organic layer HL1 may not be formed on the first top surface PD1-U and may be locally formed in only the first opening OP1.

Referring to FIG. 7F, the method may include forming a preliminary second pixel definition layer PD2-A. The preliminary second pixel definition layer PD2-A may cover the first top surface PD1-U of the first pixel definition layer PD1 and the preliminary organic layer HL1. In an exemplary embodiment, the preliminary second pixel definition layer PD2-A may have a repellency to a specific organic material. The organic material may be one of the first organic material HL-A described above and a second organic material HL-B to be described below.

Referring to FIG. 7G, the method may include forming the second pixel definition layer PD2. The second pixel definition layer PD2 may be formed by forming the second opening OP2 in the preliminary second pixel definition layer PD2-A.

The second opening OP2 may be formed by performing a photolithography process on the preliminary second pixel definition layer PD2-A. The photolithography process for forming the second opening OP2 may be performed using a second mask MS2. The second opening OP2 may be formed to be overlapped with the first opening OP1 and to penetrate the preliminary second pixel definition layer PD2-A.

Referring to FIGS. 7H and 7I, the method may include forming an upper organic layer HL2. The upper organic layer HL2 may be formed by an inkjet printing process. For example, the formation of the upper organic layer HL2 may include providing a second organic material HL-B to fill the first opening OP1 and the second opening OP2 and drying the second organic material HL-B.

The upper organic layer HL2 may be formed by filling the first opening OP1 and the second opening OP2 with the second organic material HL-B, which is supplied through first nozzles NZ1. For example, the second organic material HL-B may be formed to fill the first opening OP1 and the second opening OP2 and to cover the preliminary organic layer HL1, the first top surface PD1-U, and the second side surface PD2-S. The second top surface PD2-U may be exposed from the second organic material HL-B.

The upper organic layer HL2 may be formed by removing an organic solvent from the second organic material HL-B.

In an exemplary embodiment, in the case where the first organic material HL-A and the second organic material HL-B are formed of the same material, the preliminary organic layer HL1 and the upper organic layer HL2 may be defined as an organic layer HL.

In the case where the first organic material HL-A is the same as the second organic material HL-B, a thickness of the organic layer HL may be defined as a sum of thicknesses of the preliminary organic layer HL1 and the upper organic layer HL2 and may be larger than a thickness of the preliminary organic layer HL1.

According to an exemplary embodiment, since the organic layer HL is formed by performing the inkjet printing process twice, it may be possible to form the organic layer HL to a desired thickness. This may make it possible to improve reliability of the organic light emitting element OD.

According to an exemplary embodiment, the first top surface PD1-U may be exposed from the organic layer HL, the second pixel definition layer PD2 may be spaced apart from the organic layer HL2. Owing to the liquid repellent properties of the pixel definition layers PD1 and PD2, the organic layer HL may not be formed on the first top surface PD1-U and may be locally formed in only the first opening OP1.

Referring to FIG. 7J, the organic light emitting element OD and the encapsulation layer TFE may be formed on the base substrate SB by a plurality of deposition and coating processes.

In an exemplary embodiment, the organic layer HL in the organic light emitting element OD may be the hole control layer HL described with reference to FIG. 4A.

FIGS. 8A and 8B are sectional views illustrating a method of fabricating a display device according to an exemplary embodiment. In the following description, the same element as that of FIGS. 1, 2, 3A, 3B, 3C, 4A, 4B, 4C, 5A, 5B, 5C, 5D, 6A, 6B, 7A, 7B, 7C, 7D, 7E, 7F, 7G, 7H, 7I, and 7J will be identified by the same or similar reference number without repeating an overlapping description thereof.

FIG. 8A illustrates a structure corresponding to that of FIG. 7E. In an exemplary embodiment, the method may further include performing an additional liquid repellent treatment process on the top surface PD1-U of the first pixel definition layer PD1. The additional liquid repellent treatment process may be performed after the formation of the preliminary organic layer HL1.

The additional liquid repellent treatment process may be performed on the top surface PD1-U of the first pixel definition layer PD1 to compensate the deterioration of the repellency caused by the plasma treatment PT. In the additional liquid repellent treatment process, fluorine compound ($CF_4$) may be used as a reaction gas, which is supplied by second nozzles NZ2. Fluorine (F) in the fluorine compound ($CF_4$) may be decomposed to produce a fluorine ion, and the produced fluorine ion may be adsorbed on the top surface PD1-U of the first pixel definition layer PD1. A liquid repellent layer FL having the top surface PD1-U, on which is the fluorine (F) is adsorbed, is depicted as dotted patterns. The top surface PD1-U with the liquid repellent layer FL may have a low surface energy and thereby have a hydrophobic surface to an organic material, which will be formed in a subsequent step.

Thereafter, as shown in FIG. 8B, an inkjet process and deposition process may be performed to form the organic light emitting element OD on the base substrate SB with the liquid repellent layer FL.

FIGS. 9A, 9B, 9C, 9D, 9E, 9F, and 9G are sectional views illustrating a method of fabricating a display device according to an exemplary embodiment. In the following description, the same element as that of FIGS. 1, 2, 3A, 3B, 3C, 4A, 4B, 4C, 5A, 5B, 5C, 5D, 6A, 6B, 7A, 7B, 7C, 7D, 7E, 7F, 7G, 7H, 7I, and 7J will be identified by the same or similar reference number without repeating an overlapping description thereof.

FIG. 9A illustrates a structure corresponding to that of FIG. 7C. In an exemplary embodiment, the first pixel definition layer PD1, which the first opening OP1 exposing the first electrode E1 is formed, may be formed on the base substrate SB.

Referring to FIGS. 9B and 9C, the method may include forming a protection layer PTL. The protection layer PTL may be formed by an inkjet printing process. For example, the formation of the preliminary organic layer may include providing a first organic material PTL-A through third nozzles NZ3 in the first opening OP1 to expose the first top surface PD1-U and drying the first organic material PTL-A.

In an exemplary embodiment, the first top surface PD1-U may be exposed from the protection layer PTL. The protection layer PTL may be formed by removing an organic solvent from the first organic material PTL-A.

Referring to FIGS. 9D and 9E, the method may include forming a second pixel definition layer. The formation of the second pixel definition layer may be performed in the same manner as the formation of the second pixel definition layer described with reference to FIG. 7G.

Referring to FIG. 9F, the method may include removing the protection layer. In one of the embodiments described with reference to FIG. 7H, the first organic material HL-A may be formed of the same material as the second organic material HL-B. Thus, the organic layer HL may be formed through two inkjet printing processes.

Alternatively, in the case where the first organic material PTL-A for the protection layer PTL is different from the second organic material HL-B (e.g., of FIG. 7H) for the upper organic layer HL2 (e.g., of FIG. 7I), the protection layer PTL may be used as a functional layer for forming the second pixel definition layer PD2, and then, may be removed in a process, which is performed before the formation of the organic layer HL (e.g., of FIG. 7J).

Figure 10:
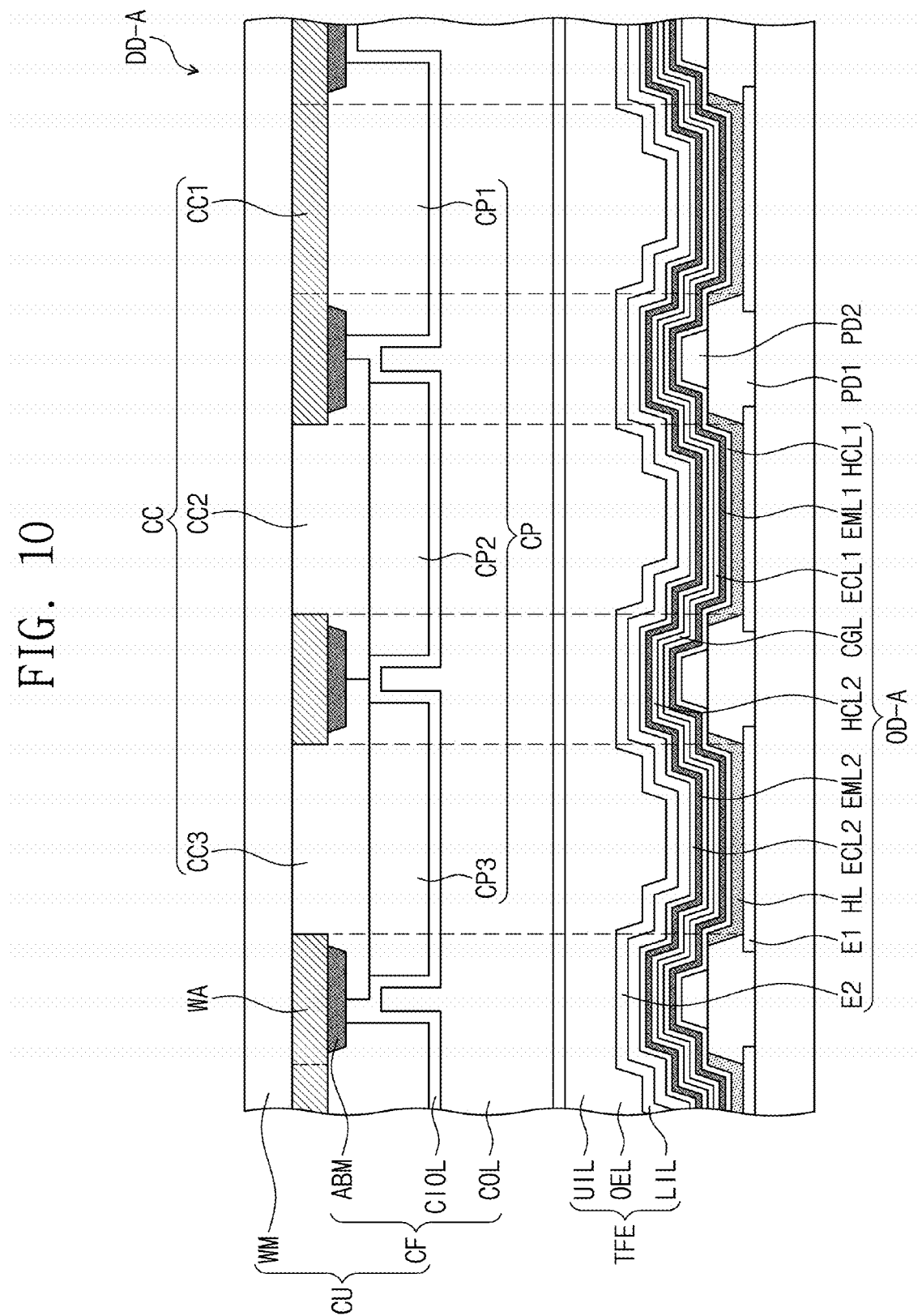
FIG. 10 is a sectional view illustrating a display device according to an exemplary embodiment.

FIG. 10 is a sectional view illustrating a display device according to an exemplary embodiment. In the following description, an element described with reference to FIGS. 1, 2, 3A, 3B, 3C, 4A, 4B, and 4C will be identified by the same or similar reference number without repeating an overlapping description thereof. To reduce complexity in illustration, elements of the circuit device layer CL described with reference to FIG. 4A are not illustrated in FIG. 10.

Referring to FIG. 10, a display device DD-A according to an exemplary embodiment may include an organic light emitting device OD-A including at least one light emitting layer. In an exemplary embodiment, the display device DD-A may further include a cover panel CU. The cover panel CU may include a window layer WM and an optical layer CF.

The organic light emitting device OD-A may include the first electrode E1, the second electrode E2, a plurality of light emitting layers EML1 and EML2, a charge generation layer CGL, a plurality of hole control layers HCL1 and HCL2, and a plurality of electron control layers ECL1 and ECL2.

The light emitting layers EML1 and EML2 may be disposed between a first electrode layer E1 and a second electrode layer E2. Each of the light emitting layers EML1 and EML2 may include a host material and a dopant material. In each of the light emitting layers EML1 and EML2, a phosphorescent or fluorescent light emitting material may be used as dopants included in the host material.

The host material may include Alq3(tris(8-hydroxyquinolino)aluminum), CBP(4,4'-bis(N-carbazolyl)-1,1'-biphenyl), PVK(poly(n-vinylcabazole)), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl) anthracene), DSA(distyrylarylene), CDBP(4,4'-bis(9-carbazolyl)-2,2'-dimethyl-biphenyl), MADN(2-Methyl-9, 10-bis(naphthalen-2-yl)anthracene), and so forth, but the exemplary embodiments are not limited thereto.

Color of light emitted from the light emitting layer may be determined by combination of the host and dopant materials. For example, if it is necessary to realize a light emitting layer emitting a red light, the light emitting layer may include a fluorescent material containing PBD:Eu(DBM)3(Phen)(tris(dibenzoylmethanato)phenanthoroline europium) or Perylene.

Here, the dopant material included in light emitting layer may be selected from metal complexes (e.g., PIQIr(acac) (bis(1-phenylisoquinoline)acetylacetonate iridium), PQIr(acac)(bis(1-phenylquinoline)acetylacetonate iridium), PQIr(tris(1-phenylquinoline)iridium) and PtOEP (octaethylporphyrin platinum)) or organometallic complexes.

If it is necessary to realize a light emitting layer emitting a green light, the light emitting layer may include a fluorescent material containing Alq3(tris(8-hydroxyquinolino) aluminum). Here, the dopant material included in light emitting layer may be selected from metal complexes (e.g., Ir(ppy)3(fac-tris(2-phenylpyridine)iridium)) or organometallic complexes.

If it is necessary to realize a light emitting layer emitting a blue light, the light emitting layer may include a fluorescent material containing one selected from the group consisting of spiro-DPVBi, spiro-6P, DSB (distyryl-benzene), DSA(distyryl-arylene), PFO(Polyfluorene)-based polymers, and PPV(poly(p-phenylene vinylene)-based polymers. Here, the dopant material included in light emitting layer may be selected from metal complexes (e.g., (4,6-F2ppy) 2Irpic) or organometallic complexes.

The light emitting layers EML1 and EML2 may include a first light emitting layer EML1 and a second light emitting layer EML2 disposed on the first light emitting layer EML1. In the present embodiment, the first light emitting layer EML1 and the second light emitting layer EML2 may generate lights of different colors, respectively.

The first light emitting layer EML1 may generate a first light. The first light emitting layer EML1 may be disposed to be closer to the first electrode layer E1 that the second light emitting layer EML2.

The first light emitting layer EML1 may generate light, whose wavelength is relatively lower than that of light emitted from the second light emitting layer EML2. The first light may have a wavelength range from 450 nm to 595 nm. For example, the first light may be a light having a blue color.

The second light emitting layer EML2 may generate a second light. The second light emitting layer EML2 may be farther apart from the first electrode layer E1, compared with the first light emitting layer EML1. The second light emitting layer EML2 may generate light whose wavelength is relatively long compared with light generated in the second light emitting layer EML2.

The second light may have a specific color, which can produce a white color light when mixed with the first light. The second light may have a wavelength range from 570 nm to 590 nm. For example, the second light may have a light having a yellow color.

Meanwhile, this is just an exemplary embodiment, and in an exemplary embodiment, the first and second light emitting layers EML1 and EML2 may be designed to produce lights of various colors. However, the exemplary embodiments are not limited to a specific example or embodiment.

The first and second light emitting layers EML1 and EML2 may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

The charge generation layer CGL may be disposed between the first and second light emitting layers EML1 and EML2 and may double the current efficiency, compared with a single light emitting layer. If a voltage is applied to the charge generation layer CGL, a redox reaction may be produced to form a complex, and during this process, an electric charge may be generated in the charge generation layer CGL.

The charge generation layer CGL may include at least one of n-type aryl amine-based compounds or p-type metal oxides. For example, the charge generation layer CGL may include a charge generation compound, which is made of at least one of aryl amine-based organic compound, metals, metal oxides, carbides, fluorides, or mixtures thereof.

The aryl amine-based organic compound may be, for example, α-NPD, 2-TNATA, TDATA, MTDATA, sprio-TAD, or sprio-NPB. The metals may be, for example, cesium (Cs), molybdenum (Mo), vanadium (V), titanium (Ti), tungsten (W), barium (Ba), or lithium (Li). The metal oxides, carbides, and fluorides may be, for example, $Re_2O_7$, $MoO_3$, $V_2O_5$, $WO_3$, $TiO_2$, $Cs_2CO_3$, BaF, LiF, or CsF.

A first hole control layer HCL1 may be disposed between the first electrode layer E1 and the first light emitting layer EML1. A second hole control layer HCL2 may be disposed between the charge generation layer CGL and the second light emitting layer EML2.

When the first electrode layer E1 is defined as an anode electrode layer, holes injected from the first electrode layer E1 may pass through the first hole control layer HCL1 and may arrive at the first light emitting layer EML1. Holes generated in the charge generation layer CGL may pass through the second hole control layer HCL2 and may arrive at the second light emitting layer EML2.

Each of the first and second hole control layers HCL1 and HCL2 may include at least one of a hole injection region, a hole transport region, a buffer region, or an electron blocking region. Each of the first and second hole control layers HCL1 and HCL2 may be a single layer made of a single material or a single layer made of several different materials or may have a multi-layered structure including multiple layers made of several different materials.

For example, each of the first and second hole control layers HCL1 and HCL2 may include at least one of a hole injection layer corresponding to the hole injection region, a hole transport layer corresponding to the hole transport region, or a single layer having both of a hole injection function and a hole transport function.

Each of the first and second hole control layers HCL1 and HCL2 may be composed of at least one of a hole injection material and a hole transport material. Each of the hole injection material and the hole transport material may be selected from the known materials.

The hole transport material may include at least one of, for example, may include at least one of carbazole derivatives (e.g., N-phenylcarbazole or polyvinylcarbazole), fluorine derivatives, TPD(N,N'-bis(3-methylphenyl)-N,N'-diphenyl-[1,1-biphenyl]-4,4'-diamine), triphenylamine derivatives (e.g., TCTA(4,4',4"-tris(N-carbazolyl)triphenylamine)), NPB(N,N'-di(1-naphthyl)-N,N'-diphenylbenzidine), or TAPC(4,4'-Cyclohexylidene bis[N,N-bis(4-methylphenyl)benzenamine]), but the hole transport material is not limited to the above examples. The hole injection material may include at least one of, for example, phthalocyanine compounds (e.g., copper phthalocyanine), DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino)triphenylamine), TDATA(4,4'4"-Tris(N,N-diphenylamino)triphenylamine), 2TNATA(4,4',4"-tris {N,-(2-naphthyl)-N-phenylamino}-triphenylamine), PEDOT/PSS(Poly(3,4-ethylenedioxythiophene)/Poly(4-styrenesulfonate)), PANI/DBSA(Polyaniline/Dodecylbenzenesulfonic acid), PANI/CSA(Polyaniline/Camphor sulfonicacid), or PANI/PSS ((Polyaniline)/Poly(4-styrenesulfonate)), but the hole injection material is not limited to the above examples.

Each of the first and second hole control layers HCL1 and HCL2 may be formed by a process similar to that for the first and second light emitting layers EML1 and EML2. For example, each of the first and second hole control layers HCL1 and HCL2 may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

Each of the first and second hole control layers HCL1 and HCL2 may include a hole blocking layer corresponding to a hole blocking region. Here, each of the first and second hole control layers HCL1 and HCL2 may include at least one of known hole blocking materials. In addition, each of the first and second hole control layers HCL1 and HCL2 may further include a charge generation material.

A first electron control layer ECL1 may be disposed between the first light emitting layer EML1 and the charge generation layer CGL. Electrons generated in the charge generation layer CGL may pass through the first electron control layer ECL1 and may arrive at the first light emitting layer EML1.

A second electron control layer ECL2 may be disposed between the second light emitting layer EML2 and the second electrode layer E2. When the second electrode layer E2 is a cathode electrode layer, electrons injected from the second electrode layer E2 may pass through the second electron control layer ECL2 and may arrive at the second light emitting layer EML2.

Each of the first and second electron control layers ECL1 and ECL2 may include at least one of an electron injection region, an electron transport region, or a hole blocking region. Each of the first and second electron control layers ECL1 and ECL2 may be a single layer made of a single material or a single layer made of several different materials or may have a multi-layered structure including multiple layers made of several different materials.

For example, each of the first and second electron control layers ECL1 and ECL2 may include at least one of an electron injection layer corresponding to the electron injection region, an electron transport layer corresponding to the electron transport region, and a single layer having both of an electron injection function and an electron transport function.

Each of the first and second electron control layers ECL1 and ECL2 may include at least one of an electron transport material and an electron injection material. For example, the electron transport material may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl)anthracene), and mixtures thereof, but the electron transport material is not limited to these examples.

In addition, the electron injection material may include LiF, LiQ (Lithium quinolate), Li2O, BaO, NaCl, CsF, lanthanide metals (e.g., Yb), or halide metals (e.g., RbCl and RbI), or a material, in which an electron transport material and an insulating organometallic salt are mixed, but the electron injection material is not limited to these examples.

The organometallic salt may be a material whose energy band gap is about 4 eV or higher. In detail, the organometallic salt may include, for example, metal acetate, metal benzoate, metal acetoacetate, metal acetylacetonate, or metal stearate.

Each of the first and second electron control layers ECL1 and ECL2 may be formed by at least one of various methods, such as a vacuum deposition method, a spin coating method, a cast method, a Langmuir-Blodgett (LB) method, an inkjet printing method, a laser printing method, and a laser-induced thermal imaging (LITI) method.

The cover panel CU may include the window layer WM and the optical layer CF. The cover panel CU may be disposed on the encapsulation layer TFE to cover the entire front surface of the display element layer OL. The window layer WM may include a front surface exposed to the outside. An image displayed on the display element layer OL may be provided to the outside through the front surface of the window layer WM.

The window layer WM may have a single- or multi-layered structure. For example, the window layer WM may have a stacking structure including a plurality of plastic films, which are coupled to each other by an adhesive layer, or may have a stacking structure including a glass substrate and a plastic film, which are coupled to each other by an adhesive layer. The window layer WM may be optically transparent. For example, the window layer WM may include glass or plastic.

A front surface of the window layer WM may include a transmission region and a bezel region, when viewed in a plan view. The transmission region may be a region transmitting light, which is provided from the display element layer OL. The transmission region may have a shape corresponding to the active region DD-DA of the display device DD-A. For example, the transmission region may be overlapped with the entire or partial region of a front surface of the active region DD-DA. Thus, the image IM, which is displayed on the active region DD-DA of the display device DD-A, may be provided to the outside through the transmission region.

The bezel region may be a region having a relatively low optical transmittance, compared with the transmission region. The bezel region may define a shape of the transmission region. The bezel region may be adjacent to the transmission region and may have a closed loop shape enclosing the transmission region.

The bezel region may have a predetermined color. The bezel region may cover the non-active region DD-NDA and may prevent or suppress the non-active region DD-NDA from being recognized by a user. For example, in the case where light generated from the display element layer OL is leaked to the non-active region DD-NDA, the bezel region may block the leaked light, and thus, the non-active region DD-NDA may be prevented or suppressed from being recognized by a user.

The cover panel CU may be disposed on the second inorganic encapsulation layer UIL of the encapsulation layer TFE. The optical layer CF may include a partition wall layer WA, a reflection layer CC, a light-blocking layer ABM, and a color filter layer CP, which are disposed on the transmission region.

The partition wall layer WA may be disposed on the window layer WM. For example, the partition wall layer WA may be disposed on a rear surface of the window layer WM. The partition wall layer WA may be disposed on the rear surface of the window layer WM to prevent or suppress elements of the display device DD-A from being recognized by light incident from the outside to the window layer WM. The partition wall layer WA may include a light-blocking organic material. The partition wall layer WA may have a specific color. For example, the partition wall layer WA may have a blue color.

A plurality of openings may be defined in the partition wall layer WA. At least a portion of the rear surface of the window layer WM may be exposed through the openings in the partition wall layer WA.

The reflection layer CC may be disposed on the rear surface of the window layer WM. The reflection layer CC, along with the partition wall layer WA, may prevent or suppress the elements of the display device DD-A from being recognized by light incident from the outside.

The reflection layer CC may include first to third reflection patterns CC1, CC2, and CC3. Each of the first to third reflection patterns CC1, CC2, and CC3 may be disposed in a corresponding one of the openings.

The first to third reflection patterns CC1, CC2, and CC3 may block or transmit lights of different colors. For example, the first reflection pattern CC1 may transmit only blue light and the second reflection pattern CC2 may transmit only red light while blocking the blue light. The third reflection pattern CC3 may transmit only green light while blocking the blue light.

The first to third reflection patterns CC1, CC2, and CC3 may include organic materials blocking lights of different colors. The first to third reflection patterns CC1, CC2, and CC3 may have colors different from each other. For example, the first reflection pattern CC1 may be blue, the second reflection pattern CC2 may be red, and the third reflection pattern CC3 may be green.

In an exemplary embodiment, the first reflection pattern CC1 and the partition wall layer WA may be formed by the same process. Thus, the first reflection pattern CC1 may include the same material as the partition wall layer WA and may have the same color as the partition wall layer WA. For convenience in description, the first reflection pattern CC1 and the partition wall layer WA are illustrated as separate elements by using dotted lines, but the first reflection pattern CC1 may be substantially a part of the partition wall layer WA.

The light-blocking layer ABM may be disposed on the partition wall layer WA. The light-blocking layer ABM may not be overlapped with the active region DD-DA. The light-blocking layer ABM may include an optically opaque material. For example, the light-blocking layer ABM may include at least one of metallic particles whose metallic element includes at least one of chromium (Cr), silver (Ag), molybdenum (Mo), nickel (Ni), titanium (Ti), or tantalum (Ta), oxides of the metallic particles, or organic materials.

The color filter layer CP may improve color reproduction characteristics of lights provided from the display device DD-A. The color filter layer CP may include first to third color patterns CP1, CP2, and CP3. Each of the first to third color patterns CP1, CP2, and CP3 may be overlapped with a corresponding one of the first to third reflection patterns CC1, CC2, and CC3. For example, the first color pattern CP1 may be disposed on the first reflection pattern CC1. The second color pattern CP2 may be disposed on the second reflection pattern CC2, and the third color pattern CP1 may be disposed on the third reflection pattern CC3.

In an exemplary embodiment, the first color pattern CP1 may display the same color as that of light provided from the display element layer OL. For example, the blue light generated by the display element layer OL may pass through the first color pattern CP1 as it is. The first color pattern CP1, which corresponds to a region emitting the blue light, may include a material, in which fluorescent bodies or quantum dots are not included, and which transmits the blue light incident thereto. The first color pattern CP1 may further include an element causing the scattering of an incident light.

For example, the first color pattern CP1 may include at least one of titanium oxide ($TiO_2$), polymer (e.g., photosensitive resin), blue dye, or blue pigment, but the exemplary embodiments are not limited thereto. For example, if a material does not cause a change in color of the blue light, it may be used for the first color pattern CP1.

Each of the second color pattern CP2 and the third color pattern CP3 may include a plurality of quantum dots for the light conversion. The quantum dot may include a core. The core of the quantum dot may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, ZnS, ZnSe, ZnTe, ZnO, HgS, HgSe, HgTe, MgSe, and MgS), mixtures of the binary compounds, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InNP, InNAs, InNSb, InPAs, InPSb, and GaAlNP), mixtures of the ternary compounds, quaternary compounds (e.g., including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and mixtures thereof. The IV compounds may include binary compounds selected from the group consisting of SiC, SiGe, and mixtures thereof.

Here, the binary, ternary, or quaternary compound may have a uniform concentration throughout the particle or may have a spatially varying concentration distribution in each particle. In an exemplary embodiment, the quantum dot may have a core-shell structure, which includes a core containing the afore-described nanocrystal and a shell surrounding the core. At an interface between the core and the shell, an element contained in the shell may have a concentration gradient decreasing in a central direction.

In certain exemplary embodiments, each of the quantum dots may have a core/shell structure, in which one quantum dot is enclosed by another quantum dot. The shell of the quantum dot may be used as a protection layer, which prevents or suppresses chemical characteristics of the core from being changed and preserves the semiconductor property of the core, and/or may be used as a charging layer, which allows the quantum dot to have an electrophoresis property. The shell may be a single layer or a multiple layer. At an interface between the core and the shell, an element contained in the shell may have a concentration gradient decreasing in a central direction.

For example, the oxide compounds of metallic or non-metallic elements for the shell may include binary compounds (e.g., $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$) and ternary compounds (e.g., $MgAl_2O_4$, $CoFe_2O_4$, $NiFe_2O_4$, and $CoMn_2O_4$), but the exemplary embodiments are not limited thereto.

In addition, the semiconductor compounds for the shell may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the exemplary embodiments are not limited thereto.

Each of the quantum dots may have a light-emitting wavelength spectrum whose full width half maximum (FWHM) is less than about 45 nm (in particular, less than about 40 nm or in more particular, less than about 30 nm), and in this case, it may be possible to realize improved color purity or color reproduction characteristics. Furthermore, the quantum dots may allow light to be emitted radially, and thus, it may be possible to improve a viewing angle property.

In an exemplary embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the exemplary embodiments are not limited thereto.

A wavelength or color of light emitted from the quantum dot may be determined by a particle size of the quantum dot, and by providing quantum dots of various sizes, it may be possible to realize various colors (e.g., blue, red, and green).

According to an exemplary embodiment, a second pixel definition layer may be disposed on a first pixel definition layer to enhance a repellency of the first pixel definition layer to an organic material deteriorated by a plasma treatment process. Accordingly, reliability of an organic light emitting element may be improved.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a circuit device layer comprising a transistor;
    a display element layer comprising:
        a first electrode connected to the transistor;
        a second electrode disposed on the first electrode;
        an organic light emitting layer disposed between the first electrode and the second electrode;
        a hole control layer disposed between the first electrode and the organic light emitting layer;
        a first layer comprising a first opening exposing the first electrode; and
        a second layer disposed on the first layer, the second layer comprising a second opening overlapping the first opening; and
    an encapsulation layer disposed on the display element layer,
    wherein:
    a top surface of the first layer is exposed by the hole control layer and the second layer;
    the hole control layer is in contact with the first electrode;
    the second electrode is in contact with the top surface of the first layer and a side surface of the second layer defining the second opening; and
    the first layer and the second layer contain a same liquid-repellent material.

2. The display device of claim 1, wherein:
    the first layer has a first repellency to the organic light emitting layer, the first repellency obtained by reducing an initial repellency of the first layer through a plasma treatment, and
    the second layer has a second repellency to the organic light emitting layer, the second repellency being greater than the first repellency.

3. The display device of claim 1, wherein a width of the first opening in a direction is smaller than a width of the second opening in the direction.

4. The display device of claim 1, wherein the first opening comprises a plurality of first openings and the second opening comprises a plurality of second openings, and
    wherein the plurality of first openings and the plurality of second openings corresponding to the first openings are overlapped with each other in a plan view.

5. The display device of claim 4, wherein the first electrode comprises a plurality of first electrodes, the plurality of first electrodes overlapping the first openings, respectively, and
    wherein the second electrode overlaps with the first electrodes.

6. The display device of claim 1, wherein the second electrode covers the second layer, the top surface of the first layer, and the organic light emitting layer.

7. The display device of claim 6, wherein the encapsulation layer comprises a first inorganic encapsulation layer covering the second electrode, a second inorganic encapsulation layer disposed on the first inorganic encapsulation layer, and an organic encapsulation layer interposed between the first inorganic encapsulation layer and the second inorganic encapsulation layer.

8. The display device of claim 1, wherein the second layer is spaced apart from the organic light emitting layer.

9. The display device of claim 1, wherein a side surface of the first layer defining the first opening and the side surface of the second layer defining the second opening are provided to form a stepwise structure.

10. The display device of claim 1, wherein the display element layer further comprises an electron control layer covering the exposed top surface of the first layer.

11. A display device, comprising:
a first layer comprising a first opening;
a second layer disposed on the first layer, the second layer comprising a second opening overlapped with the first opening is defined; and
an organic light emitting element comprising a first electrode exposed by the first opening, a second electrode disposed on the first electrode, an organic light emitting layer disposed between the first electrode and the second electrode, and a hole control layer disposed between the first electrode and the organic light emitting layer,
wherein:
the first layer and the second layer contain a same liquid-repellent material;
the first layer has a first repellency to the organic light emitting layer, the first repellency obtained by reducing an initial repellency of the first layer through a plasma treatment;
the second layer has a second repellency to the organic light emitting layer, the second repellency being greater than the first repellency of the first layer;
the hole control layer is in contact with the first electrode;
a top surface of the first layer is exposed by the hole control layer and the second layer; and
the second electrode is in contact with the top surface of the first layer and a side surface of the second layer defining the second opening.

12. The display device of claim 11, wherein the top surface of the first layer is exposed by the organic light emitting layer and the hole control layer.

13. The display device of claim 11, wherein the second layer is spaced apart from the organic light emitting layer.

14. The display device of claim 11, wherein each of the organic light emitting layer and the hole control layer overlaps each of the first opening and the second opening.

15. The display device of claim 11, wherein a width of the first opening in a direction is smaller than a width of the second opening in the direction.

* * * * *